United States Patent
Master et al.

(10) Patent No.: US 9,319,066 B2
(45) Date of Patent: Apr. 19, 2016

(54) PARALLEL PROCESSING OF DATA HAVING DATA DEPENDENCIES FOR ACCELERATING THE LAUNCH AND PERFORMANCE OF OPERATING SYSTEMS AND OTHER COMPUTING APPLICATIONS

(71) Applicant: Sviral, Inc., Sunnyvale, CA (US)

(72) Inventors: Paul L. Master, Sunnyvale, CA (US); Frederick Curtis Furtek, Menlo Park, CA (US); Kim Knuttila, San Jose, CA (US); L. Brian McGann, Sunnyvale, CA (US)

(73) Assignee: Sviral, Inc., Sunnyvale, CA (US)

( * ) Notice: Subject to any disclaimer, the term of this patent is extended or adjusted under 35 U.S.C. 154(b) by 0 days.

(21) Appl. No.: 14/751,371

(22) Filed: Jun. 26, 2015

(65) Prior Publication Data

US 2015/0381203 A1    Dec. 31, 2015

Related U.S. Application Data

(60) Provisional application No. 62/017,388, filed on Jun. 26, 2014.

(51) Int. Cl.
*H03M 7/40* (2006.01)
*H03M 7/46* (2006.01)
*G06F 3/06* (2006.01)

(52) U.S. Cl.
CPC .............. *H03M 7/46* (2013.01); *G06F 3/0608* (2013.01); *G06F 3/0643* (2013.01); *G06F 3/0679* (2013.01)

(58) Field of Classification Search
CPC ...... H03M 7/46; G06F 3/0608; G06F 3/0679; G06F 3/0643
USPC .................................................. 341/65, 67
See application file for complete search history.

(56) References Cited

U.S. PATENT DOCUMENTS

| | | | | |
|---|---|---|---|---|
| 5,583,500 A * | 12/1996 | Allen | ................... | H03M 7/4006 341/107 |
| 6,819,271 B2 * | 11/2004 | Geiger | .................... | H03M 7/30 341/51 |
| 6,885,319 B2 * | 4/2005 | Geiger | .................... | H03M 7/30 341/51 |
| 7,395,345 B2 * | 7/2008 | Fallon | ................... | G06F 3/0608 709/231 |
| 8,847,798 B2 * | 9/2014 | Pell | ........................ | H03M 5/145 341/67 |
| 8,947,273 B2 * | 2/2015 | Bartnik | ......................... | 341/107 |

* cited by examiner

*Primary Examiner* — Khai M Nguyen
(74) *Attorney, Agent, or Firm* — Nancy R. Gamburd; Gamburd Law Group LLC

(57) ABSTRACT

Representative embodiments are disclosed for a rapid and highly parallel decompression of compressed executable and other files, such as executable files for operating systems and applications, having compressed blocks including run length encoded ("RLE") data having data-dependent references. An exemplary embodiment includes a plurality of processors or processor cores to identify a start or end of each compressed block; to partially decompress, in parallel, a selected compressed block into independent data, dependent (RLE) data, and linked dependent (RLE) data; to sequence the independent data, dependent (RLE) data, and linked dependent (RLE) data from a plurality of partial decompressions of a plurality of compressed blocks, to obtain data specified by the dependent (RLE) data and linked dependent (RLE) data, and to insert the obtained data into a corresponding location in an uncompressed file. The representative embodiments are also applicable to other types of data processing for applications having data dependencies.

51 Claims, 11 Drawing Sheets

WAS WITHOUT FORM, VOID; DARKNESS UPO FACE OF DEEP. SPIRIT
<53,5> <9,5> <40,5> <122,6> <11,5> <85,9>

RTH.001:002 AND THE EARTH WAS WITHOUT FORM, AND VOID; AND

<61,6>
3 2 1 0
<21,12>
2 1 0 9 8 7 6 5 4 3 2 1 0
2 1 0 9 8 7 6 5 4 3 2 1 0 9 8 7 6 5 4 3 2 1 0
<3,5>
9 8 7 6 5 4 3 2 1 0
0 9 8 7 6 5 4 3 2 1 0 9 8 7 6 5 4 3 2 1 0 9 8 7
<9,5>
5 4 3 2 1 0 9 8 7 6 5 4 3 2 1 0 9 8 7 6 5 4 3 2 1 0
3 2 1 0 9 8 7 6 5 4 3 2 1 0 9 8 7 6 5 4 3 2 1 0 9 8 7
4 3 2 1 0 9 8 7 6 5 4 3 2 1 0 9 8 7 6 5 4 3 2 1 0 9 8
1 0 9 8 7 6 5 4 3 2 1 0 9 8 7 6 5 4 3 2 1 0 9 8 7 6 5

GOD MOVED UPON THE FACE OF THE WATERS.

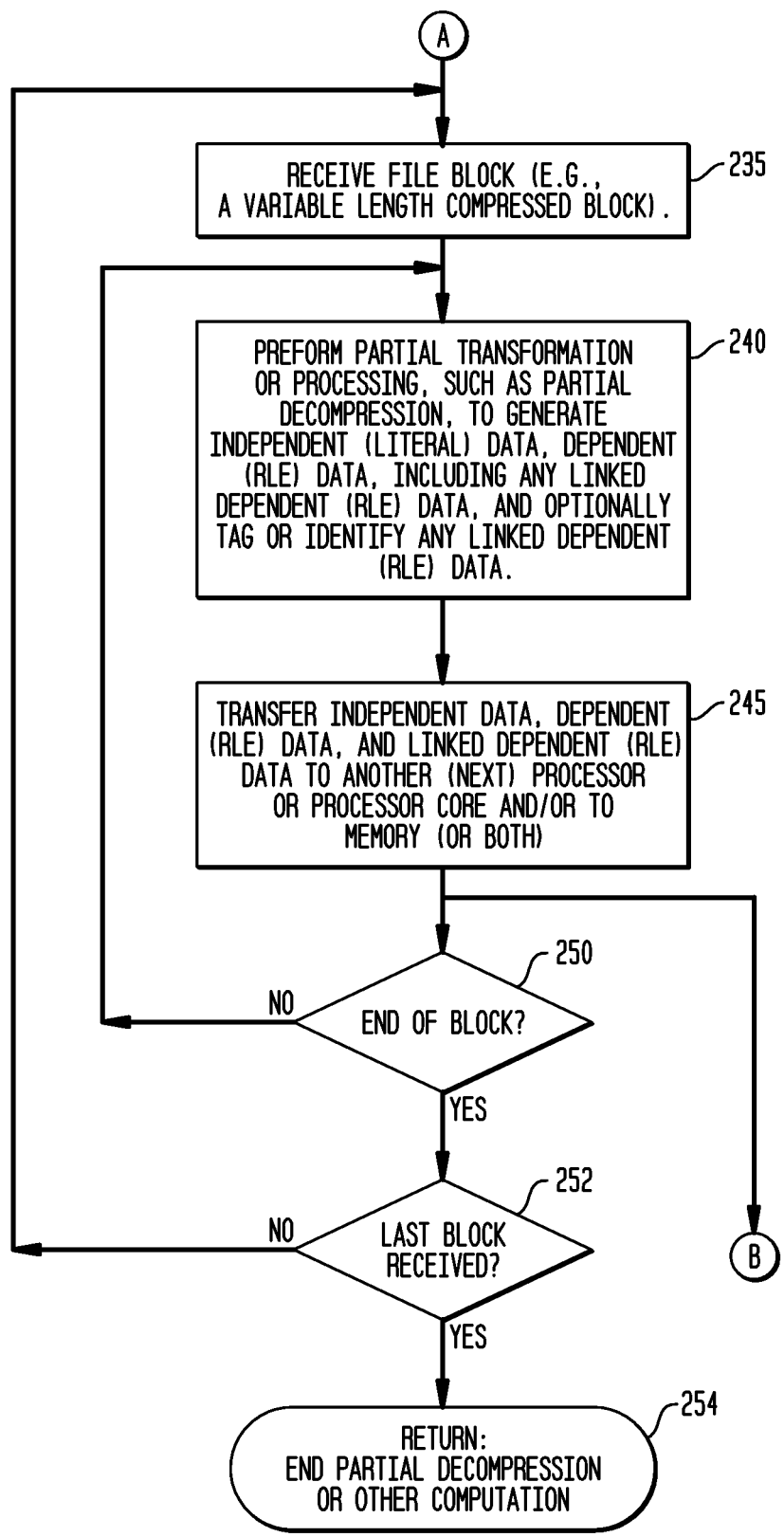

PARALLEL PROCESSING OF DATA HAVING DATA DEPENDENCIES FOR ACCELERATING THE LAUNCH AND PERFORMANCE OF OPERATING SYSTEMS AND OTHER COMPUTING APPLICATIONS

CROSS-REFERENCE TO A RELATED APPLICATION

This application is a nonprovisional and claims the benefit of and priority to U.S. Provisional Patent Application No. 62/017,388, filed Jun. 26, 2014, inventors Paul L. Master et al., titled "Parallel Decompression of Compressed Executable Files for Accelerating the Launch and Performance of Applications", which is commonly assigned herewith, and all of which is hereby incorporated herein by reference in its entirety with the same full force and effect as if set forth in its entirety herein.

FIELD OF THE INVENTION

The present invention relates generally to computing applications, and more specifically to the parallel processing of data having data dependencies, such as the parallel decompression of compressed executable files, for accelerating the launch and performance of operating systems and other computing applications.

BACKGROUND

Many devices, especially mobile devices such as smartphones and computing tablets, store executable files in a compressed form in nonvolatile memory (such a FLASH memory). For example, smartphones and tablets which use an Android operating system, for example, store the executable instructions for virtually every application or program as a compressed file in a FLASH memory, enabling the use of a smaller and less expensive FLASH memory than would otherwise be required. In addition, in many devices, the operating system itself or parts of the operating system may also be stored as compressed files. These compressed files must be decompressed, without loss of data, into the complete executable file before the corresponding application can execute, i.e., before the application can be launched and start operating.

Such an executable file may be compressed using any compression algorithm or methodology. Many are compressed using the GNU "Gzip" or other variations, such as Linux "Gunzip", for example and without limitation. These compressed files are typically comprised of a plurality of variable length blocks, with run length encoding ("RLE"), which creates significant data dependencies throughout the entire compressed file. For example, Gzip employs RLE across multiple blocks and requires a moving window of about 32 Kbytes, i.e., decoding a current symbol may reference an earlier symbol as far back as 32 Kbytes within the file. In addition, compression algorithms such as Gzip do not preserve data which might be useful in the decompression, such as the actual length of any given block. While the compression of a file may be done in parallel, such as by dividing a file into segments and compressing each segment, it has been widely believed (and publicly stated by the creator of Gzip) that it is "impossible" to decompress such compressed files in parallel, largely due to the difficulties mentioned above.

Historically, the time required for decompression of an executable file was not a concern because the compressed executable file was required to be decompressed only once, such as during initial installation of the application, at which point the decompressed executable file would be stored in memory and be available for execution. Now, however, while less space in nonvolatile memory may be advantageous for various devices, the trade-off is that every time such an application is launched (e.g., for every mobile telephone call), it must be read from the nonvolatile memory and decompressed, which takes considerable time, namely, enough time delay (or lag time) to be noticeable by the consumer or other user.

Various decompression programs, such as "pigz", purport to provide for parallel decompression of Gzip compressed data. The pigz program, however, only utilizes a single, serial thread for the actual decompression of the compressed data, and is parallel only insofar as it provides additional threads in parallel for non-decompression functionality, such as reading, writing, and check calculations.

Accordingly, a need remains for an apparatus, system, method, and software for data-dependent parallel processing, to accelerate executable file processing, application processing, and data processing. For example, such an apparatus, system, method, and software should provide for acceleration of the decompression of compressed files, such as through the parallel decompression of compressed executable files, including operating systems and program applications. Such an apparatus, system, method, and software further should provide such acceleration for compression algorithms which have been viewed as "impossible" to accelerate, such as Gzip, and further should be extendable to the acceleration of the operation and execution of other types of computing applications, such as operating systems, Linux kernel, Java, Javascript, AOT, gaming applications, and so on, to result in faster boot operations, faster execution of an application, and an enhanced user experience.

SUMMARY OF THE INVENTION

The representative or exemplary embodiments of the present invention provide numerous advantages. Representative embodiments provide for a rapid and highly parallel data-dependent processing, to accelerate executable file processing, application processing, and data processing, including the rapid and highly parallel decompression of compressed executable and other files, such as executable files for operating systems and applications. For example, such a compressed file typically has a plurality of compressed blocks including run length encoded ("RLE") data having data-dependent references spanning multiple compressed blocks.

Various implementations have demonstrated a dramatic improvement in the decompression time required to boot or launch applications, consistently across a wide variety of systems and devices. For example, the booting of an Android operating system, which typically takes about 21 seconds, has been reduced as low as about 3.2 seconds, roughly an improvement of about 7×, i.e., operating system loading which is seven times faster using representative embodiments. The launching of Firefox has been reduced from about 4.4 seconds to 0.72 seconds, while the launching of Google Maps has been reduced from about 0.925 seconds to 0.22 seconds, and the launching of Chrome has been reduced from about 1.1 seconds to 0.24 seconds. It should be noted that each of these programs has been compressed and stored in a FLASH memory using a compression algorithm such as Gzip or Gunzip, the parallel decompression of which heretofore were considered "impossible". The various representative embodiments have not only rendered the "impossible" possible, but have done so with dramatic acceleration results and significantly noticeable improvement in performance to be favorably noticed by a user and provide a better, enhanced user experience, particularly with tablet and smartphone applications.

While the various embodiments are illustrated and discussed with reference to an example of parallel decompression of a compressed file having data-dependent references spanning multiple compressed blocks, those having skill in the art will recognize the wider applicability of the exemplary embodiments, allowing for the accelerated, parallel processing of applications and/or data having data dependencies. All such embodiments are considered equivalent and within the scope of the claims herein.

For purposes of the present disclosure, "independent" data, as used herein, means and refers to data which does not have any data dependencies within that particular or selected sequence, stream or string of data. For example, in data compression, such independent data may also be described as "literal" data, such as a string of characters or digits (such as ASCII code) which are not themselves run length encoded and, therefore, that sequence, stream or string of data does not depend for its interpretation, processing, or decompression upon another, separate or second sequence, stream or string of data. In contrast, "dependent" data, as used herein, means and refers to a sequence, stream or string of data which has data dependencies and, therefore, that sequence, stream or string of data does depend for its interpretation, processing, or decompression upon another, separate or second sequence, stream or string of data, such as being dependent upon independent (e.g., literal) data or further dependent upon other dependent data, forming a chain or linkage of data dependencies, i.e., multiple levels of data dependencies. For example, in data compression, such dependent data may be RLE data which simply consists of and provides a reference to or refers to the position or location (e.g., bit or character position or relative bit or character position) and size (e.g., count or string length) of other data, which may be independent (literal) data or additional RLE data, and which may be within the same or a different block. In addition, also in data compression, such dependent data may be RLE data which simply provides a reference to other RLE data, and in such case, may be referred to herein as "linked" dependent data or "multiple" dependent data (i.e., data having multiple levels of data dependencies), such as linked RLE data consisting of first RLE data which provides a reference to the location and size of another, second sequence, stream or string of data which also includes second RLE data within that second sequence, stream or string of data which provides a reference to the location and size of another, third sequence, stream or string of data, and so on, creating potentially innumerable levels of data dependencies.

In a representative embodiment, an apparatus is disclosed for parallel decompression of a compressed file, with the apparatus comprising: a first, nonvolatile memory storing the compressed file, the compressed file having a plurality of compressed blocks, the compressed file comprising independent data and dependent, run length encoded ("RLE") data having data-dependent references spanning multiple compressed blocks of the plurality of blocks; one or more decompression processors or processor cores, of a plurality of processors or processor cores, each decompression processor or processor core programmed, adapted or configured to partially decompress a selected block into the independent data, the dependent RLE data, and any linked dependent RLE data; and one or more aggregation and merge processors or processor cores, of the plurality of processors or processor cores, at least one aggregation and merge processor or processor core programmed, adapted or configured to sequence the independent data, dependent RLE data, and linked dependent RLE data from a plurality of partial decompressions of the plurality of compressed blocks, and at least one aggregation and merge processor or processor core programmed, adapted or configured to obtain data specified by the dependent RLE data and linked dependent RLE data, and insert the obtained data into corresponding locations to form an uncompressed data file.

In a representative embodiment, the apparatus may further comprise: a plurality of decompression processors or processor cores, of the plurality of processors or processor cores, each decompression processor or processor core of the plurality of decompression processors or processor cores programmed, adapted or configured to partially decompress a corresponding selected block of the plurality of compressed blocks, in parallel, into the independent data, the dependent RLE data, and the linked dependent RLE data.

In a representative embodiment, the apparatus may further comprise: at least one distributor processor or processor core, of the plurality of processors or processor cores, programmed, adapted or configured to identify a start or end of each compressed block of the plurality of compressed blocks and transfer a single or individuated compressed block to the one or more computation processors or processor cores. For example, the at least one distributor processor or processor core, of the plurality of processors or processor cores, may be further programmed, adapted or configured to identify the start or end of a selected compressed block of the plurality of compressed blocks by performing a partial decompression of the selected block.

Also for example, the at least one distributor processor or processor core may be operative in a first pipelined stage, the one or more decompression processors or processor cores may be operative in a second pipelined stage, and the one or more aggregation and merge processors or processor cores may be operative in a third pipelined stage.

In a representative embodiment, the apparatus may further comprise: a plurality of distributor processors or processor cores, of the plurality of processors or processor cores, with each distributor processor or processor core of the plurality of distributor processors or processor cores programmed, adapted or configured to identify the start or end of one or more compressed blocks of the plurality of compressed blocks, in parallel, and transfer a single or individuated compressed block to the one or more computation processors or processor cores. For such a representative embodiment, each distributor processor or processor core may be further programmed, adapted or configured to identify the start or end of a selected compressed block of the plurality of compressed blocks by performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores.

In another representative embodiment, at least one of the processors or processor cores is further programmed, adapted or configured to create and store, in the memory, metadata indicating a start or end of each compressed block of the plurality of compressed blocks. For such a representative embodiment, at least one distributor processor or processor core, of the plurality of processors or processor cores, may be programmed, adapted or configured to utilize the stored metadata to identify the start or end of the selected compressed block of the plurality of compressed blocks.

In a representative embodiment, the apparatus may further comprise: a cyclic redundancy check processor or processor core of the plurality of processors or processor cores programmed, adapted or configured to perform a cyclic redundancy check of the uncompressed data file.

In another representative embodiment, the apparatus may further comprise: a second, random access memory, wherein at least one aggregation and merge processor or processor core is further programmed, adapted or configured to store the independent data in order in the second memory, to subsequently obtain data specified by the dependent RLE data and linked dependent RLE data, and insert the obtained data into corresponding locations in the second memory to form the uncompressed data file.

In another representative embodiment, at least one of the processors or processor cores is further programmed, adapted or configured to compress and store the uncompressed data file in the memory as a second compressed file having a plurality of second compressed blocks which have data dependencies solely within a given second compressed block of the plurality of second compressed blocks. For such a representative embodiment, at least one distributor processor or processor core, of the plurality of processors or processor cores, programmed, adapted or configured to transfer each second compressed block of the plurality of second compressed blocks to the one or more decompression processors or processor cores.

In another representative embodiment, at least one of the processors or processor cores is further programmed, adapted or configured to tag or identify the linked dependent RLE data. For such a representative embodiment, at least one aggregation and merge processor or processor core is further programmed, adapted or configured to use the tag or identification of the linked dependent RLE data to sequence the obtaining of the data specified by the linked dependent RLE data subsequent to the obtaining of the data specified by the dependent RLE data.

In a representative embodiment, the apparatus is embodied as a smartphone or tablet computer.

A processor-implemented method for parallel decompression of a compressed fil is also disclosed, with the compressed file having a plurality of compressed blocks, the compressed file comprising independent data and dependent, run length encoded ("RLE") data having data-dependent references spanning multiple compressed blocks of the plurality of blocks, and with the method comprising: using one or more decompression processors or processor cores, of a plurality of processors or processor cores, partially decompressing a selected block into the independent data, the dependent RLE data, and any linked dependent RLE data; and using one or more aggregation and merge processors or processor cores, of the plurality of processors or processor cores, sequencing the independent data, dependent RLE data, and linked dependent RLE data from a plurality of partial decompressions of the plurality of compressed blocks, and obtaining data specified by the dependent RLE data and linked dependent RLE data, and insert the obtained data into corresponding locations to form an uncompressed data file.

In a representative embodiment, the method may further comprise: using a plurality of decompression processors or processor cores, of the plurality of processors or processor cores, partially decompressing a corresponding selected block of the plurality of compressed blocks, in parallel, into the independent data, the dependent RLE data, and the linked dependent RLE data.

In a representative embodiment, the method may further comprise: using at least one distributor processor or processor core, of the plurality of processors or processor cores, identifying a start or end of each compressed block of the plurality of compressed blocks and transferring a single or individuated compressed block to the one or more computation processors or processor cores. For such a representative embodiment, the step of identifying the start or end of a selected compressed block of the plurality of compressed blocks may further comprise: performing a partial decompression of the selected block.

In a representative embodiment, the method may further comprise: using a plurality of distributor processors or processor cores, of the plurality of processors or processor cores, identifying the start or end of one or more compressed blocks of the plurality of compressed blocks, in parallel, and transferring a single or individuated compressed block to the one or more computation processors or processor cores. For such a representative embodiment the step of identifying the start or end of a selected compressed block of the plurality of compressed blocks may further comprise: performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores.

In another representative embodiment, the method may further comprise: creating and storing, in a memory, metadata indicating a start or end of each compressed block of the plurality of compressed blocks. For such a representative embodiment, the method may further comprise: using at least one distributor processor or processor core, of the plurality of processors or processor cores, utilizing the stored metadata to identify the start or end of the selected compressed block of the plurality of compressed blocks.

In another representative embodiment, the method may further comprise: using at least one processor or processor core of the plurality of processors or processor cores, performing a cyclic redundancy check of the uncompressed data file.

In a representative embodiment, the method may further comprise: using at least one aggregation and merge processor or processor core, storing the independent data in order in a memory, subsequently obtaining data specified by the dependent RLE data and linked dependent RLE data, and inserting the obtained data into corresponding locations in the memory to form the uncompressed data file.

In yet another representative embodiment, the method may further comprise: using at least one of the processors or processor cores, compressing and storing the uncompressed data file in a memory as a second compressed file having a plurality of second compressed blocks which have data dependencies solely within a given second compressed block of the plurality of second compressed blocks. For such a representative embodiment, the method may further comprise: using at least one distributor processor or processor core, of the plurality of processors or processor cores, transferring each second compressed block of the plurality of second compressed blocks to the one or more decompression processors or processor cores.

In another representative embodiment, the method may further comprise: using at least one of the processors or processor cores, tagging or identifying the linked dependent RLE data. For such a representative embodiment, the method may further comprise: using at least one aggregation and merge processor or processor core, using the tag or identification of the linked dependent RLE data to sequence the obtaining of the data specified by the linked dependent RLE data subsequent to the obtaining of the data specified by the dependent RLE data.

In a representative embodiment, the method may be operative in a smartphone or tablet to accelerate booting of an operating system or to accelerate launching of a computing application.

A non-transitory, tangible medium storing computer- or processor-readable software having a plurality of executable instructions for execution by one or more processors or processor cores for parallel decompression of a compressed file is also disclosed, with the plurality of executable instructions operative in a smartphone or tablet to accelerate booting of an operating system or to accelerate launching of a computing application, the compressed file having a plurality of compressed blocks, the compressed file comprising independent data and dependent, run length encoded ("RLE") data having data-dependent references spanning multiple compressed blocks of the plurality of blocks, with the non-transitory, tangible medium comprising: one or more executable instructions, of the plurality of executable instructions, to cause one or more decompression processors or processor cores, of a plurality of processors or processor cores, to partially decompress a selected block into the independent data, the dependent RLE data, and any linked dependent RLE data; and one or more executable instructions, of the plurality of executable instructions, to cause one or more aggregation and merge processors or processor cores, of the plurality of processors or processor cores, to sequence the independent data, dependent RLE data, and linked dependent RLE data from a plurality of partial decompressions of the plurality of compressed blocks, to obtain data specified by the dependent RLE data and linked dependent RLE data, and to insert the obtained data into corresponding locations to form an uncompressed data file.

In a representative embodiment, the non-transitory, tangible medium may further comprise: one or more executable instructions, of the plurality of executable instructions, to cause a plurality of decompression processors or processor cores, of the plurality of processors or processor cores, to partially decompress a corresponding selected block of the plurality of compressed blocks, in parallel, into the independent data, the dependent RLE data, and the linked dependent RLE data.

In a representative embodiment, the non-transitory, tangible medium may further comprise: one or more executable instructions, of the plurality of executable instructions, to cause at least one distributor processor or processor core, of the plurality of processors or processor cores, to identify a start or end of each compressed block of the plurality of compressed blocks by performing a partial decompression of the selected block and transfer a single or individuated compressed block to the one or more computation processors or processor cores.

In another representative embodiment, the non-transitory, tangible medium may further comprise: one or more executable instructions, of the plurality of executable instructions, to cause a plurality of distributor processors or processor cores, of the plurality of processors or processor cores, to identify the start or end of one or more compressed blocks of the plurality of compressed blocks, in parallel, by performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores, and to transfer a single or individuated compressed block to the one or more computation processors or processor cores.

In another representative embodiment, the non-transitory, tangible medium may further comprise: one or more executable instructions, of the plurality of executable instructions, to cause one or more processors or processor cores, of the plurality of processors or processor cores, to create and store, in a memory, metadata indicating a start or end of each compressed block of the plurality of compressed blocks. For such a representative embodiment, the non-transitory, tangible medium may further comprise: one or more executable instructions, of the plurality of executable instructions, to cause at least one distributor processor or processor core, of the plurality of processors or processor cores, to utilize the stored metadata to identify the start or end of the selected compressed block of the plurality of compressed blocks.

In another representative embodiment, the non-transitory, tangible medium may further comprise: one or more executable instructions, of the plurality of executable instructions, to cause at least one processor or processor core of the plurality of processors or processor cores, to perform a cyclic redundancy check of the uncompressed data file.

In another representative embodiment, the non-transitory, tangible medium may further comprise: one or more executable instructions, of the plurality of executable instructions, to cause at least one aggregation and merge processor or processor core, to store the independent data in order in a memory, to subsequently obtain data specified by the dependent RLE data and linked dependent RLE data, and to insert the obtained data into corresponding locations in the memory to form the uncompressed data file.

In another representative embodiment, the non-transitory, tangible medium may further comprise: using at least one of the processors or processor cores, compressing and storing the uncompressed data file in a memory as a second compressed file having a plurality of second compressed blocks which have data dependencies solely within a given second compressed block of the plurality of second compressed blocks. For such a representative embodiment, the non-transitory, tangible medium may further comprise: one or more executable instructions, of the plurality of executable instructions, to cause at least one distributor processor or processor core, of the plurality of processors or processor cores, to transfer each second compressed block of the plurality of second compressed blocks to the one or more decompression processors or processor cores.

In another representative embodiment, the non-transitory, tangible medium may further comprise: one or more executable instructions, of the plurality of executable instructions, to cause at least one of the processors or processor cores, to tag or identify the linked dependent RLE data; and one or more executable instructions, of the plurality of executable instructions, to cause at least one aggregation and merge processor or processor core, to use the tag or identification of the linked dependent RLE data to sequence the obtaining of the data specified by the linked dependent RLE data subsequent to the obtaining of the data specified by the dependent RLE data.

In another representative embodiment, an apparatus for parallel decompression of a compressed file is disclosed, with the apparatus comprising: a first, nonvolatile memory storing the compressed file, the compressed file having a plurality of compressed blocks, the compressed file comprising independent data and dependent, run length encoded ("RLE") data having data-dependent references spanning multiple compressed blocks of the plurality of blocks, the first memory further storing metadata indicating a start or end of each compressed block of the plurality of compressed blocks; at least one distributor processor or processor core, of a plurality of processors or processor cores, programmed, adapted or configured to utilize the stored metadata to identify the start or end of the selected compressed block of the plurality of compressed blocks; a plurality of decompression processors or processor cores, of the plurality of processors or processor cores, each decompression processor or processor core of the plurality of decompression processors or processor cores programmed, adapted or configured to partially decompress a corresponding selected block of the plurality of compressed blocks, in parallel, into independent data, dependent RLE data, and any linked dependent RLE data; and one or more aggregation and merge processors or processor cores, of the plurality of processors or processor cores, at least one aggregation and merge processor or processor core programmed, adapted or configured to sequence the independent data, dependent RLE data, and linked dependent RLE data from a plurality of partial decompressions of the plurality of compressed blocks, and at least one aggregation and merge processor or processor core programmed, adapted or configured to obtain data specified by the dependent RLE data and linked dependent RLE data, and insert the obtained data into corresponding locations to form an uncompressed data file.

In another representative embodiment, an apparatus for parallel processing of a file is disclosed, with the apparatus comprising: a first, nonvolatile memory storing the file, the file having a plurality of blocks, the file including independent data and dependent data having data dependencies spanning multiple blocks of the plurality of blocks; a second, random access memory; at least one distributor processor or processor core, of a plurality of processors or processor cores, programmed, adapted or configured to identify a start or end of each block of the plurality of blocks and transfer a single or individuated block to the one or more computation processors or processor cores; a plurality of computation processors or processor cores, of the plurality of processors or processor cores, each computation processor or processor core coupled to the at least one distributor processor or processor core and programmed, adapted or configured to partially transform, in parallel, a selected block into independent data, dependent data, and linked dependent data; and one or more aggregation and merge processors or processor cores, of the plurality of processors or processor cores, at least one aggregation and merge processor or processor core coupled to the plurality of computation processors or processor cores and programmed, adapted or configured to sequence the independent data, dependent data, and linked dependent data from a plurality of partial transformations of a plurality of blocks, and at least one aggregation and merge processor or processor core programmed, adapted or configured to store the independent data in order in the second memory, to subsequently obtain data specified by the dependent data and linked dependent data, and insert the obtained data into a corresponding location in the second memory to form a resulting processed file.

For such a representative embodiment, at least one of the processors or processor cores may be further programmed, adapted or configured to create and store, in the memory, metadata indicating a start or end of each block of the plurality of blocks.

In a representative embodiment, the apparatus may further comprise: a plurality of distributor processors or processor cores, of the plurality of processors or processor cores, each distributor processor or processor core further programmed, adapted or configured to identify the start or end of a selected block of the plurality of compressed blocks by performing a partial transformation of the selected block, each distributor processor or processor core commencing the partial transformation at a starting point in a block having a predetermined or variable offset from partial transformation starting points of other distributor processors or processor cores of the plurality of distributor processors or processor cores. For such a representative embodiment at least one of the processors or processor cores may be further programmed, adapted or configured to tag or identify the linked dependent data, and wherein at least one aggregation and merge processor or processor core is further programmed, adapted or configured to use the tag or identification of the linked dependent data to sequence the obtaining of the data specified by the linked dependent data subsequent to the obtaining of the data specified by the dependent data.

In a representative embodiment, an apparatus is disclosed for parallel decompression of a compressed file, the compressed file having a plurality of compressed blocks, the compressed file including run length encoded ("RLE") data having data-dependent references spanning multiple compressed blocks of the plurality of blocks, with the apparatus comprising: at least one distributor processor core, of a plurality of processor cores, adapted or configurable to identify a start or end of each compressed block of the plurality of compressed blocks and transfer a single or individuated compressed block to one or more other processor cores of the plurality of processor cores; a plurality of decompression processor cores, of the plurality of processor cores, each decompression processor core of the plurality of decompression processor cores adapted or configurable to partially decompress a selected compressed block into literal data, RLE data, and linked RLE data; at least one ordering processor core, of the plurality of processor cores, adapted or configurable to sequence the literal data, RLE data, and linked RLE data from a plurality of partial decompressions of a plurality of compressed blocks; and at least one aggregation and merge processor core, of the plurality of processor cores, adapted or configurable to obtain literal data specified by the RLE data and linked RLE data and insert the obtained literal data into a corresponding location in an uncompressed file.

In a representative embodiment, such an apparatus may further comprise: a cyclic redundancy check processor core, of the plurality of processor cores, adapted or configurable to perform a cyclic redundancy check of the uncompressed file. In addition, at least one of the processor cores may be further adapted or configurable to create and store in a memory metadata indicating a start or end of each compressed block of the plurality of compressed blocks.

A representative system is disclosed for parallel decompression of a compressed file, the compressed file having a plurality of compressed blocks, the compressed file including run length encoded ("RLE") data having data-dependent references spanning multiple compressed blocks of the plurality of blocks, with the system comprising: a non-volatile memory storing the compressed file; a user interface; and at least one multicore processor having a plurality of processor cores, the at least one multicore processor coupled to the non-volatile memory and to the user interface, the multicore processor comprising: at least one distributor processor core, of a plurality of processor cores, adapted or configurable to identify a start or end of each compressed block of the plurality of compressed blocks and transfer a single or individuated compressed block to one or more other processor cores of the plurality of processor cores; a plurality of decompression processor cores, of the plurality of processor cores, each decompression processor core of the plurality of decompression processor cores adapted or configurable to partially decompress a selected compressed block into literal data, RLE data, and linked RLE data; at least one ordering processor core, of the plurality of processor cores, adapted or configurable to sequence the literal data, RLE data, and linked RLE data from a plurality of partial decompressions of a plurality of compressed blocks; and at least one aggregation and merge processor core, of the plurality of processor cores, adapted or configurable to obtain literal data specified by the RLE data and linked RLE data and insert the obtained literal data into a corresponding location in an uncompressed file.

A representative processor-implemented method is also disclosed for parallel decompression of a compressed file, the compressed file having a plurality of compressed blocks, the compressed file including run length encoded ("RLE") data having data-dependent references spanning multiple compressed blocks of the plurality of blocks, the method comprising: using at least one distributor processor core, of a plurality of processor cores, identifying a start or end of each compressed block of the plurality of compressed blocks and transferring a single or individuated compressed block to one or more other processor cores of the plurality of processor cores; using a plurality of decompression processor cores, of the plurality of processor cores, partially decompressing a selected compressed block into literal data, RLE data, and linked RLE data; using at least one ordering processor core, of the plurality of processor cores, sequencing the literal data, RLE data, and linked RLE data from a plurality of partial decompressions of a plurality of compressed blocks; and using at least one aggregation and merge processor core of the plurality of processor cores, obtaining literal data specified by the RLE data and linked RLE data and inserting the obtained literal data into a corresponding location in an uncompressed file.

A representative non-transitory, tangible medium storing computer readable software is also disclosed for parallel decompression of a compressed file, the compressed file having a plurality of compressed blocks, the compressed file including run length encoded ("RLE") data having data-dependent references spanning multiple compressed blocks of the plurality of blocks, the non-transitory, tangible medium storing computer readable software comprising: at least one program construct to cause at least one distributor processor core, of a plurality of processor cores, to identify a start or end of each compressed block of the plurality of compressed blocks and transfer a single or individuated compressed block to one or more other processor cores of the plurality of processor cores; at least one program construct to cause a plurality of decompression processor cores, of the plurality of processor cores, to partially decompress a selected compressed block into literal data, RLE data, and linked RLE data; at least one program construct to cause at least one ordering processor core, of the plurality of processor cores, to sequence the literal data, RLE data, and linked RLE data from a plurality of partial decompressions of a plurality of compressed blocks; and at least one program construct to cause at least one aggregation and merge processor core, of the plurality of processor cores, to obtain literal data specified by the RLE data and linked RLE data and insert the obtained literal data into a corresponding location in an uncompressed file.

Another representative system is also disclosed for parallel decompression of a compressed file, the compressed file having a plurality of compressed blocks, the compressed file including run length encoded ("RLE") data having data-dependent references spanning multiple compressed blocks of the plurality of blocks, the system comprising: a non-volatile memory storing the compressed file; a user interface; and a plurality of processors coupled to the non-volatile memory and to the user interface, at least one distributor processor, of the plurality of processors, adapted or configurable to identify a start or end of each compressed block of the plurality of compressed blocks and transfer a single or individuated compressed block to one or more other processors of the plurality of processors; a plurality of decompression processors, of the plurality of processors, each decompression processor adapted or configurable to partially decompress a selected compressed block into literal data, RLE data, and linked RLE data; at least one ordering processor, of the plurality of processors, adapted or configurable to sequence the literal data, RLE data, and linked RLE data from a plurality of partial decompressions of a plurality of compressed blocks; and at least one aggregation and merge processor, of the plurality of processors, adapted or configurable to obtain literal data specified by the RLE data and linked RLE data and insert the obtained literal data into a corresponding location in an uncompressed file.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIGS. 4A, 4B, 4C, and 4D, is a diagram illustrating an example of independent (literal) data, run length encoded dependent data, and a resulting decompressed data sequence.

FIG. 5, divided into FIGS. 5A, 5B, and 5C, is a flow diagram illustrating exemplary or representative method and software embodiments.

DETAILED DESCRIPTION OF REPRESENTATIVE EMBODIMENTS

Figure 1:
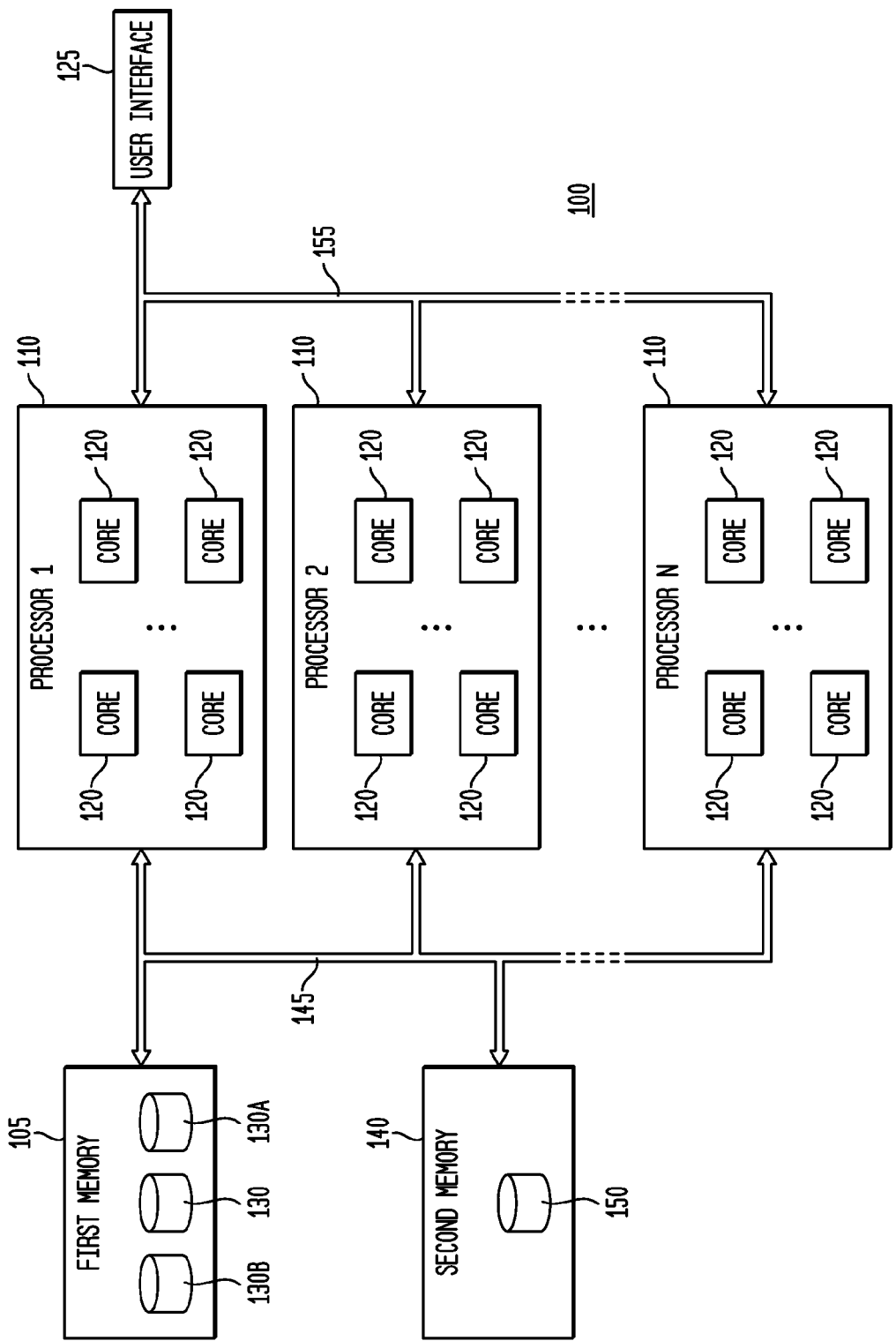
FIG. 1 is a block diagram illustrating an exemplary or representative system embodiment.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As mentioned above, for purposes of the present disclosure, "independent" data, as used herein, means and refers to data which does not have any data dependencies within that particular or selected sequence, stream or string of data. For example, in data compression, such independent data may also be described as "literal" data, such as a string of characters or digits (such as ASCII code) which are not themselves run length encoded and, therefore, that sequence, stream or string of data does not depend for its interpretation, processing, or decompression upon another, separate or second sequence, stream or string of data. In contrast, "dependent" data, as used herein, means and refers to a sequence, stream or string of data which has data dependencies and, therefore, that sequence, stream or string of data does depend for its interpretation, processing, or decompression upon another, separate or second sequence, stream or string of data, such as being dependent upon independent (e.g., literal) data or further dependent upon other dependent data, forming a chain or linkage of data dependencies, i.e., multiple levels of data dependencies. For example, in data compression, such dependent data may be RLE data which simply consists of and provides a reference to or refers to the position or location (e.g., bit or character position or relative bit or character position) and size (e.g., count or string length) of other data, which may be independent (literal) data or additional RLE data, and which may be within the same or a different block. In addition, also in data compression, such dependent data may be RLE data which simply provides a reference to other RLE data, and in such case, may be referred to herein as "linked" dependent data or "multiple" dependent data (i.e., data having multiple levels of data dependencies), such as linked RLE data consisting of first RLE data which provides a reference to the location and size of another, second sequence, stream or string of data which also includes second RLE data within that second sequence, stream or string of data which provides a reference to the location and size of another, third sequence, stream or string of data, and so on, creating potentially innumerable levels of data dependencies.

Also as mentioned above, while the various representative embodiments are illustrated and discussed with reference to an example of parallel decompression of a compressed file having data-dependent references spanning multiple compressed blocks, such as files compressed using Gzip, those having skill in the art will recognize the wider applicability of the exemplary embodiments, allowing for the accelerated, parallel processing of applications and/or data having data dependencies. For example, the various parallel and pipelined embodiments may also be utilized with other types of data compression/decompression (such as Blosc), encryption/decryption, encoding/decoding (e.g., error correction coding and decoding), hashing/dehashing, etc. All such embodiments are considered equivalent and within the scope of the claims herein.

In addition, the various representative embodiments may be implemented in many different ways. As discussed in greater detail below, the various pipelined and parallel processing may be implemented on a plurality of processors, a plurality of processor cores, or potentially multithreaded (or hyper multithreaded) on a single processor, for example and without limitation. It should be noted, however, that each such embodiment may provide greater or lesser acceleration of the selected application.

In another representative embodiment, each component functionality of the pipelined and parallel processing of the various representative embodiments may be assigned as a corresponding task, in real time, to any processor or processor core. In addition, this may be done deterministically, such as to a next processor or processor core of a predetermined sequence of processor or processor core, or non-deterministically, such as to a next available processor or processor core of a predetermined sequence of processor or processor core, e.g., a round-robin assignment to the next core which happens to be available for the task, all for example and without limitation. Accordingly, and reference herein to a processor or processor core performing a selected functionality should be understood to mean and include a task having that selected functionality which has or will be assigned to a processor or processor core.

As mentioned above, the various embodiments have demonstrated a dramatic improvement in the decompression time required to boot or launch applications, consistently across a wide variety of systems and devices. It should be noted that the representative methodologies are machine-dependent and pertain the actual physical acceleration of the operation of such devices, including smartphones and computing tablets, such as for accelerating the booting or launching of applications stored in a physical memory circuit, and are incapable of being performed by a human being, any thought process, or any pen and paper process. It should also be noted that the needs for the various embodiments have arisen largely due to the use of compressed executable files stored in a nonvolatile memory having comparatively reduced storage capacity, and the noticeable delays caused by the typical serial decompression of these compressed files of the prior art. As such, the various embodiments result in a measurable and dramatic improvement in performance of these various devices, providing a technological improvement in computing speed and computer or processor functioning, and addresses a long-felt technological need, for example and without limitation.

The various representative embodiments may also be implemented at any of a variety of levels, as discussed in greater detail below.

FIG. 1 is a block diagram illustrating an exemplary or representative system 100 embodiment. As illustrated in FIG. 1, the system 100 includes one or more processors 110 (illustrated as processors numbered 1 through N), which may be any type of processor (such as described in greater detail below); a first, nonvolatile memory 105, such as a FLASH memory; and a user interface 125, such as an interactive touch screen display, a keyboard, a keypad, a mouse, a pointer, etc. The system 100 also typically includes additional, second memory 140, which may be any type of memory, such as a random access memory (RAM, DRAM, SDRAM, SRAM, MRAM, ROM), and which may be located within or separate from the one or more processors 110, all for example and without limitation, and as discussed in greater detail below. Many processors 110 include such a memory 140 within the integrated circuit, while in other embodiments, such a memory 140 may be a separate integrated circuit, such as a DDR3 Sodimm, all for example and without limitation. The first, nonvolatile memory 105 typically stores a file 130, such as a compressed executable file 130 for a selected application, e.g., for a computing application, an operating system, a communication application, a telecommunications application, etc., for example and without limitation. The second memory 140 typically stores a file 150, such as an uncompressed executable file 150 for a selected application, e.g., for a computing application, an operating system, a communication application, a telecommunications application, etc., for example and without limitation. These various components are typically coupled to each other, directly or indirectly, as the case may be, such as through various bus structures 145, 155 as illustrated, with all such coupling arrangements and topologies considered equivalent and within the scope of the disclosure, such as those illustrated in the other Figures, for example and without limitation. Not separately illustrated, the system 100 may include a plurality of different types of processors, such as graphics processors, etc., also as discussed in greater detail below. In the illustrated embodiment, the one or more processors 110 are each illustrated as multicore processors as an option, with each processor 110 having a plurality of processor (or processing) cores 120. For example and without limitation, many processors 110 are commercially available with four to eight separate processor (or processing) cores 120, which may be referred to herein equivalently as processor cores 120, processor cores 120, or merely cores 120.

Figure 2:
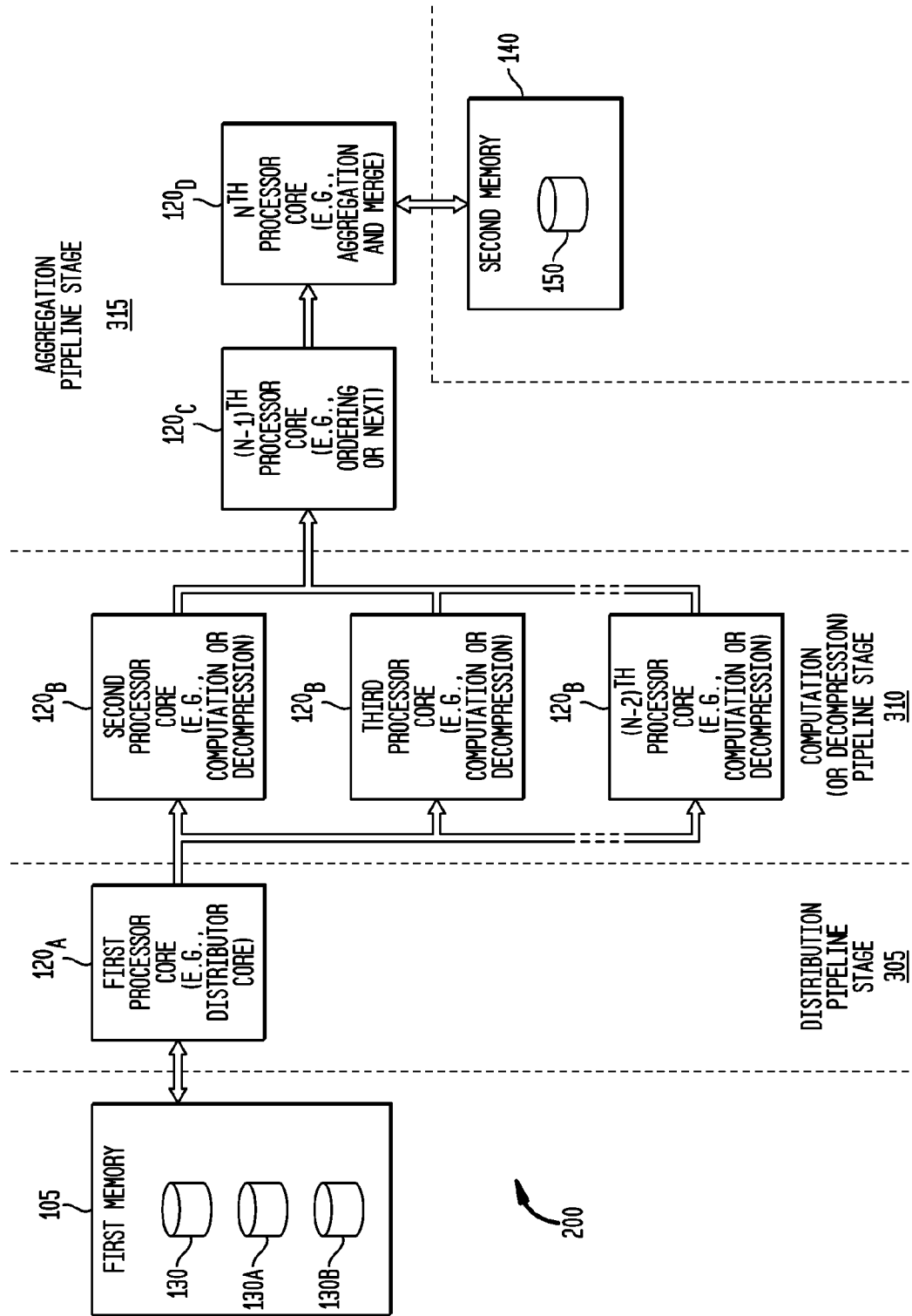
FIG. 2 is a block diagram illustrating an exemplary or representative first apparatus embodiment.
Figure 3:
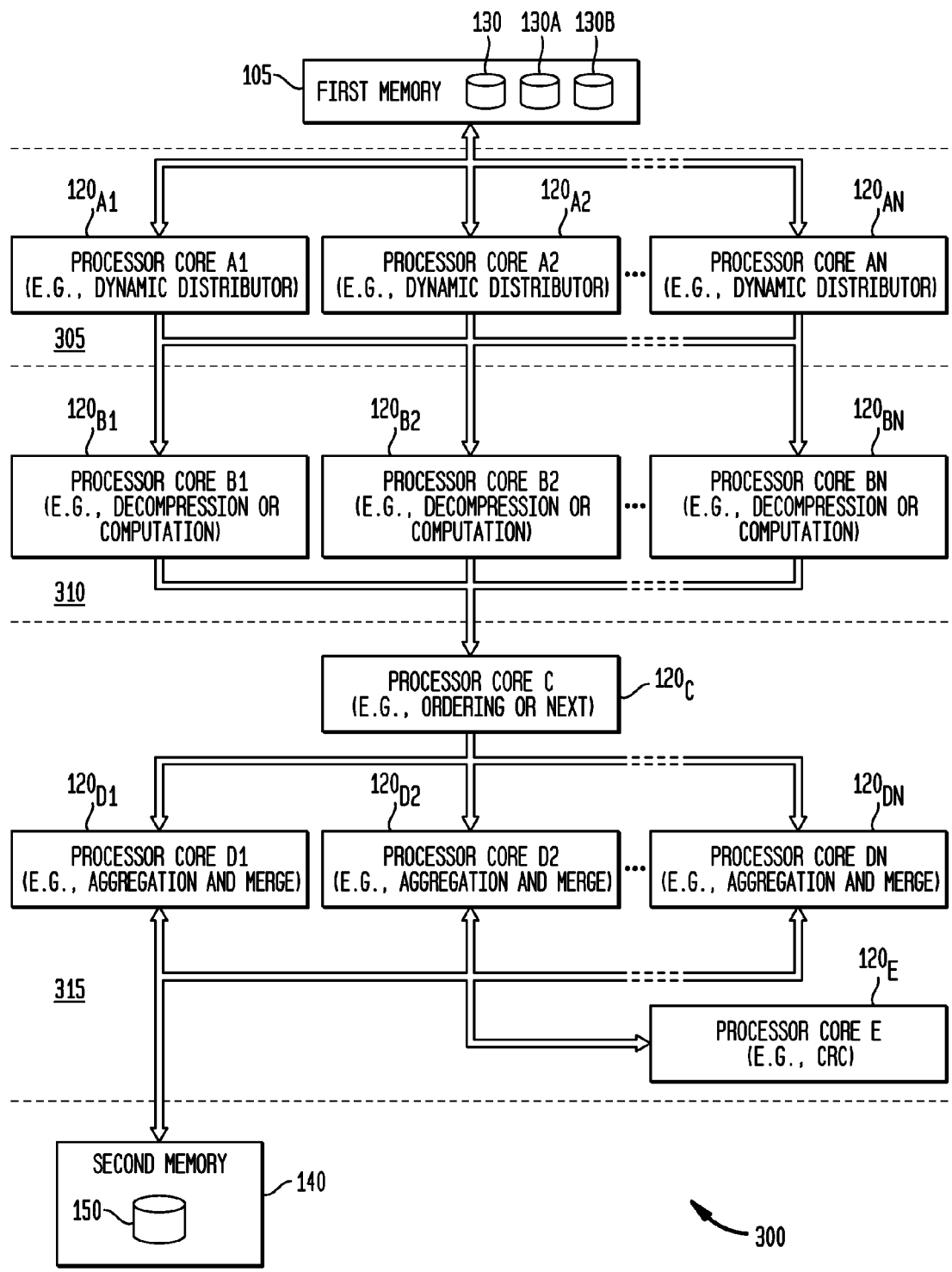
FIG. 3 is a block diagram illustrating an exemplary or representative second apparatus embodiment.

The various apparatus 200 and 300 embodiments, illustrated in FIGS. 2 and 3, are illustrated and described using a plurality of processor (or processing) cores 120. Those having skill in the electronic arts will recognize that the system, apparatus, method and software may be implemented in a wide variety of ways, such as by using a single processor 110 with a single core, or a plurality of processors 110, each of which may have a single processor core or a plurality of processor cores 120, for example and without limitation, with all such variations considered equivalent and within the scope of the present disclosure. In addition, while illustrated as a plurality of separate processor cores 120, any selected functionality may be assigned to or operating on or within any selected processor core 120, and multiple functionalities may be assigned to or operating on or within any selected processor core 120 concurrently.

Not separately illustrated in FIG. 1, a system 100 typically includes many additional components, such as power supplies, additional memory, additional input and output circuits and connectors, network interfaces, memory interfaces and drives, switching components, memory controllers, input/output controllers, etc., for example and without limitation.

FIG. 2 is a block diagram illustrating an exemplary or representative first apparatus 200 embodiment. FIG. 3 is a block diagram illustrating an exemplary or representative second apparatus 300 embodiment. Referring to FIGS. 2 and 3, each apparatus 200, 300 comprises a plurality of processor cores 120, each of which has been programmed, adapted, or configured to implement and execute a selected, specific functionality, such as for the decompression of a compressed executable file, e.g., a Gzip file. As mentioned above, such while an exemplary embodiment is described below with reference to Gzip as an exemplary compression algorithm, those having skill in the electronic arts will recognize that the system, apparatus, method and software described below may be extended to an applied to the acceleration of the launch and execution of a plurality of different types of programs, including operating systems such as Android or the various Apple operating systems, Linux kernel, Java, Javascript, AOT, gaming applications, and so on.

The dashed lines in FIGS. 2 and 3 are utilized to indicate a sequence of pipelined stages. As illustrated, the pipelined stages are a distribution pipeline stage 305, a computation pipeline stage 310 (i.e., the pipeline stage in which the selected work or functionality is performed by one or more "worker" processor cores 120), and an aggregation pipeline stage 315. Depending upon task assignment or programming, for example, any processor core 120 at any given time may be in any of the various pipeline stages 305, 310, and 315, such as when tasks are assigned dynamically to any next available processor core 120, for example.

For the file decompression example, and as discussed in greater detail below, one or more processor cores 120 are utilized in the distribution pipeline stage 305 and may be referred to as one or more processor cores $120_A$, e.g., as one or more distributor processor cores $120_A$ and/or one or more distributor processor cores $120_{A1}$, $120_{A2}$ through $120_{AN}$; one or more processor cores 120 are utilized in the computation pipeline stage 310 and may be referred to as one or more processor cores $120_B$, e.g., as one or more decompression processor cores $120_B$ and/or one or more decompression processor cores $120_{B1}$, $120_{B2}$ through $120_{BN}$; (for the decompression functionality); one or more processor cores 120 are utilized in the aggregation pipeline stage 315 and may be referred to as one or more processor cores $120_C$, processor cores 120, and processor cores $120_E$, e.g., for the decompression functionality, one or more processor cores 120 are ordering (or "next") processor cores $120_C$, one or more processor cores 120 are aggregation and merge processor cores $120_D$ and/or one or more aggregation and merge processor cores $120_{D1}$, $120_{D2}$ through $120_{DN}$;, and one or more processor cores 120 are CRC (cyclic redundancy check) processor cores $120_E$, all for example and without limitation. Any processor core 120 can be utilized for any of these functions and multiple functions, which functionality may be assigned in any way selected by the user, designer or programmer, and may be statically or dynamically assigned, as mentioned above. For example, as used in the aggregation pipeline stage 315, the functionality of an ordering (or "next") processor core $120_C$ and/or a CRC (cyclic redundancy check) processor core $120_E$ may simply be subsumed or incorporated within the functionality of one or more aggregation and merge processor cores $120_D$, and are referred to separately solely for ease of description, it being understood that the functionality of an ordering (or "next") processor core $120_C$ and/or a CRC (cyclic redundancy check) processor core $120_E$ may be included within any of the various processor cores 120 of the aggregation pipeline stage 315, as claimed herein.

Continuing with the file decompression example, the pipeline stages may also be described somewhat differently. In the computation pipeline stage 310, for example, all of the processing of data is performed by one or more processor cores $120_C$, such as to decompress a selected compressed block and obtain both dependent data (e.g., RLE data) and independent data (e.g., literal data), with the independent data then provided or written in order (by one or more processor cores $120_C$) to the memory 140 and stored as a decompressed file 150. In the aggregation pipeline stage 315, for example, all of the remaining processing of dependent data is performed by one or more processor cores 120, such as to obtain all of the specified run length encoded data and provide or write it in to the appropriate location in the decompressed file 150 in the memory 140. From this point of view, and for the broader applicability to parallel processing of data having data dependencies, the computation pipeline stage 310 may also be described equivalently as an independent data pipeline stage and the aggregation pipeline stage 315 may also be described equivalently as an dependent data pipeline stage.

Typically for a Gzip application, the file is compressed using a combination of Lempel Ziv (or Lempel Ziv Welch) encoding (such as LZ77) followed by Huffman encoding. Once compressed, the boundaries between blocks are not byte aligned, but are bit boundaries. Typically for a Gzip or Gunzip application, each block has a header block (e.g., 2 bits) which indicates whether the block is uncompressed, or compressed using a fixed or dynamic (custom) Huffman table. When fixed Huffman encoding is utilized, the end of the variable length block has a known bit pattern; conversely, when dynamic or custom Huffman encoding is utilized, the end of the variable length block may have any bit pattern. Following compression, bits having a cyclic redundancy check (CRC) are also added, typically in a first header. The last variable length block of the compressed file will have a header bit set to indicate that it is the last in the sequence of variable length blocks. The only block having a known beginning is the first variable length block, having a known starting point following the first header, and all other variable length blocks have unknown starting (and usually unknown ending) points. The size of the uncompressed output file (150) is also typically unknown prior to the decompression.

Referring to the one or more distributor processor cores $120_A$, a distributor processor core $120_A$ receives the compressed file 130 comprising a plurality of variable length blocks, and determines the beginning and/or end of each variable length block, from the first to the last variable length block, i.e., a distributor processor core $120_A$ determines the end of the current variable length block, which means it has effectively and automatically determined the start of the next variable length block. Once it finds the end of the current variable length block, a distributor processor core $120_A$ transfers the current variable length block to the next (or next available) decompression processor core $120_B$, while maintaining the ordering or ordering information of the variable length blocks. A distributor processor core $120_A$ performs decompression, such as building a dynamic Huffman table or using a fixed Huffman table, generally (and preferably only) to the extent needed to find the end of the current variable length block as quickly as practicable. Accordingly, when a distributor processor core $120_A$ has a Huffman table (or partial Huffman table) for use in decompression (i.e., the current variable length block was not uncompressed), it will also transfer that information to the next (or next available) decompression processor core $120_B$, such as by providing a pointer to location in the memory 140 location storing the fixed or dynamic Huffman table, so that a decompression processor core $120_B$ does not repeat any of the decompression work performed by the one or more distributor processor cores $120_A$ in an earlier pipeline stage.

When the current variable length block is uncompressed, the current variable length block may be transferred by the distributor processor core $120_A$ to memory 140, and a pointer to location in the memory 140 location storing the uncompressed block may be provided to the ordering (or "next") processor cores $120_C$, for tracking the location of the uncompressed data within the overall decompressed executable file (150).

As illustrated in FIG. 3, a plurality of distributor processor cores $120_A$ may be utilized and operated in parallel within this distribution pipeline stage 305. In this parallel processing application, each distributor processor core $120_A$ begins processing the compressed file 130 at a different starting point than the other distributor processor cores $120_A$, such as with a fixed or variable offset, which may be a dynamically determined or a predetermined starting point. If the starting point is, in fact, the beginning of a block, a Huffman table will be generated, and if not, errors will develop quite rapidly to indicate that the selected bit was not, in fact, the starting bit of a variable length block. In this way, while a first distributor processor core $120_A$ may be locating the end of a first variable length block, a second or next distributor processor core 120 may be locating the end of the second or next variable length block, each then transferring the variable length block (with a pointer to a Huffman table in memory 140) to a next (or next available) decompression processor core $120_B$, also while maintaining the ordering or ordering information of the variable length blocks, and provides additional acceleration on the order of about a 2× (two times) improvement in speed.

In an exemplary embodiment, for a higher level (level 2) implementation, the one or more distributor processor cores $120_A$ also record all of the start (or end) of variable length block data, as metadata, for the entire sequence of variable length blocks. This compressed file metadata is determined during the execution of the first decompression and stored in memory (e.g., nonvolatile memory 105), for each such compressed executable file, which may be on installation of the executable file or upon first execution of the executable file, for example and without limitation, and is then stored (e.g., as metadata file 130A, in either or both the first or second memories 130, 140, and illustrated as metadata file 130A stored in the first, nonvolatile memory 130) utilized for all subsequent decompressions of that compressed executable file. Using the stored metadata for the compressed executable file, having all of the start (or end) positions of all of the variable length blocks, for any and all subsequent decompressions, the one or more distributor processor cores $120_A$ may then locate the start of each variable length block and transfer each such variable length block to a next (or next available) decompression processor core $120_B$, without performing any decompression steps whatsoever, resulting in even greater acceleration, on the order of about a 2× to 4× (2 to 4 times) improvement in speed.

Each decompression processor core $120_B$, then, receives a single variable length block having compressed data from the one or more distributor processor cores $120_A$, and may also receive a pointer to a Huffman table in memory 140, which may be a dynamic or fixed Huffman table. When the decompression processor core $120_B$ receives only the variable length block having compressed data, it will use the information within the variable length block to create the dynamic or fixed Huffman table for use in the decompression. Using the Huffman table, the decompression processor core $120_B$ partially decompresses the variable length block having compressed data into two types of data: independent data (e.g., literal data) and dependent data such as run length encoded (RLE) data.

Figure 4:
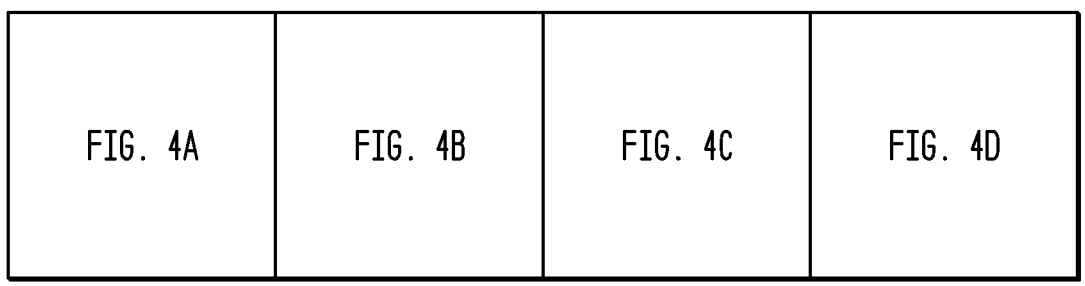
FIG. 4, divided into
Figure 4A:
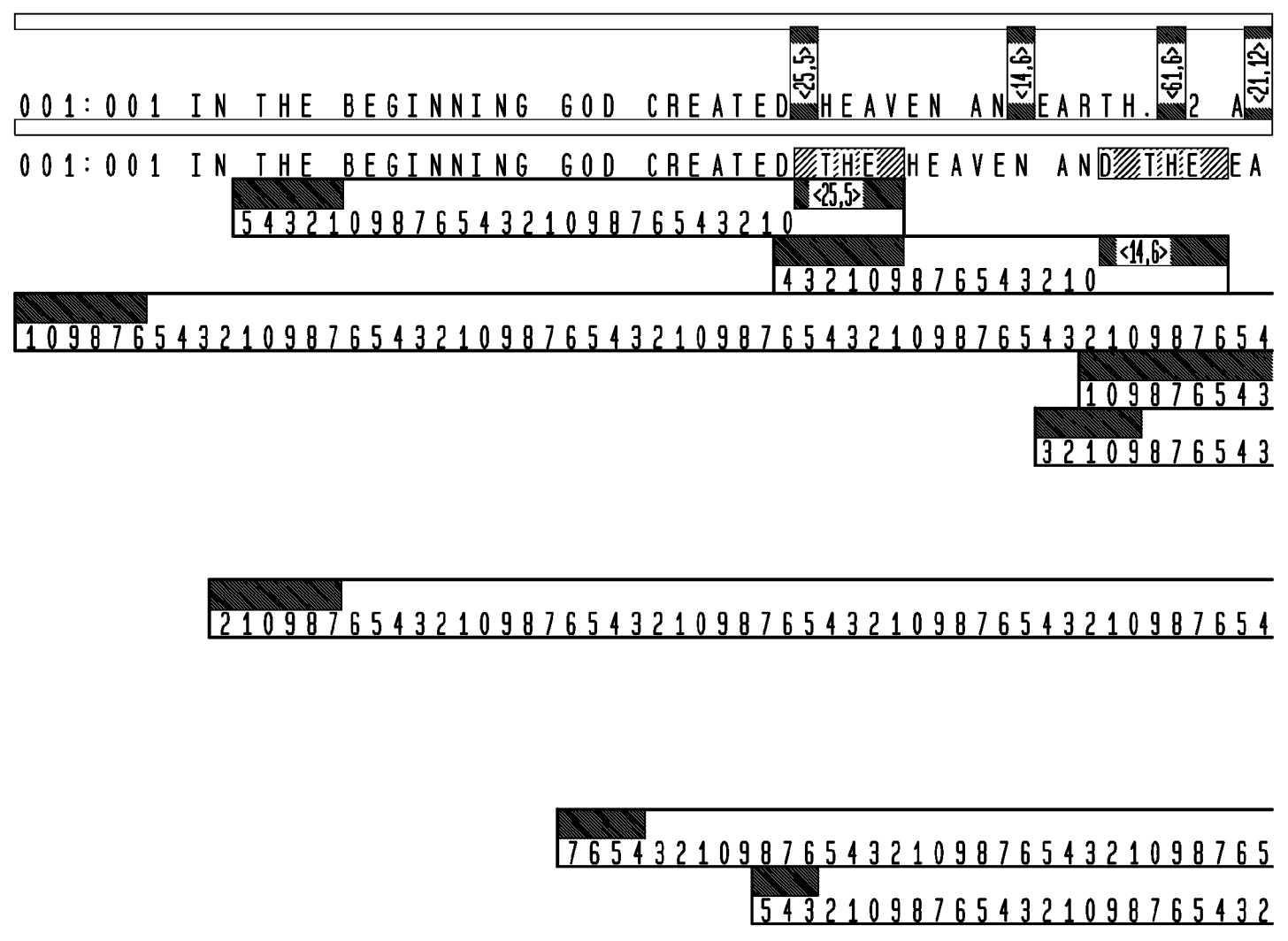
Figure 4C:
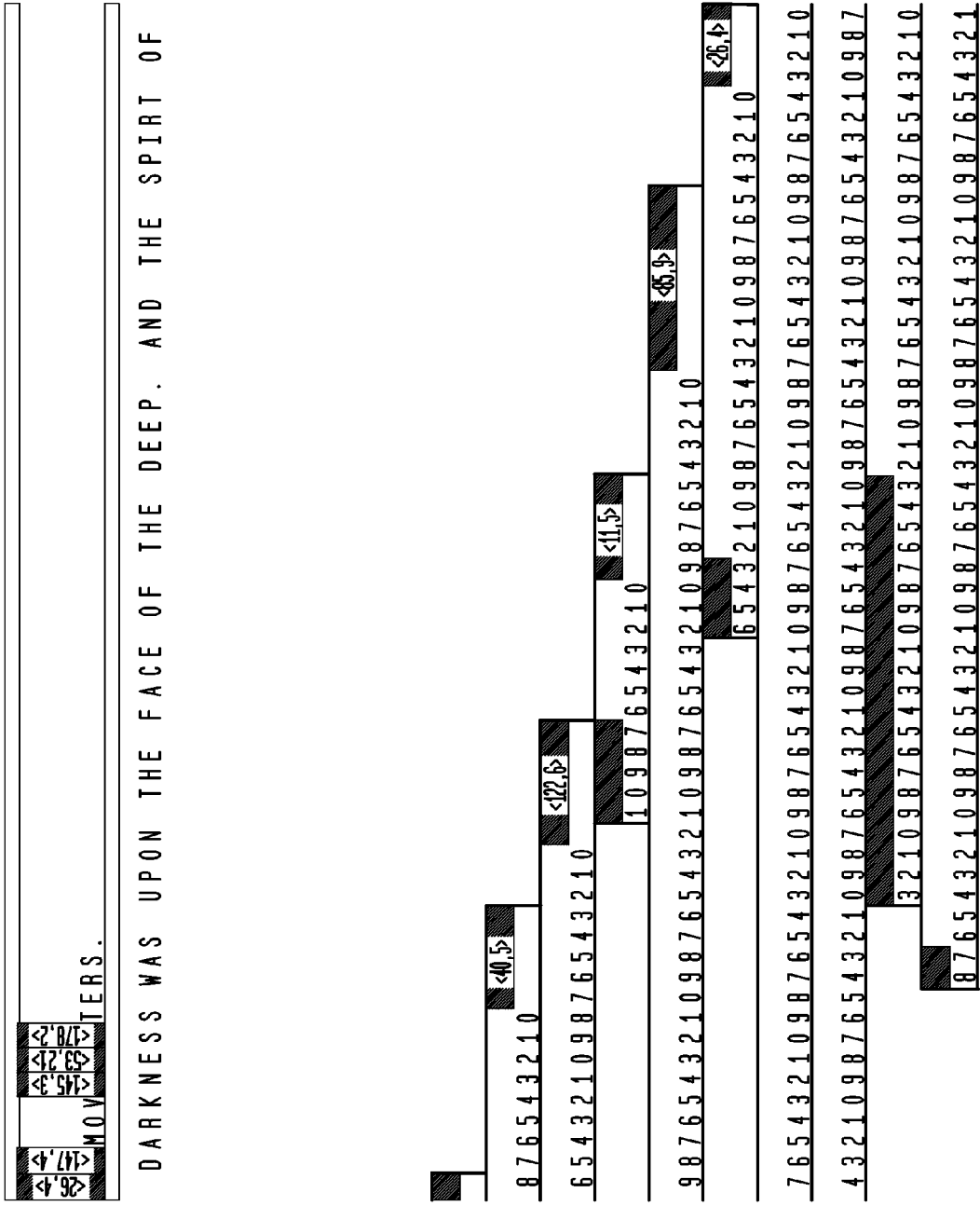
Figure 4D:
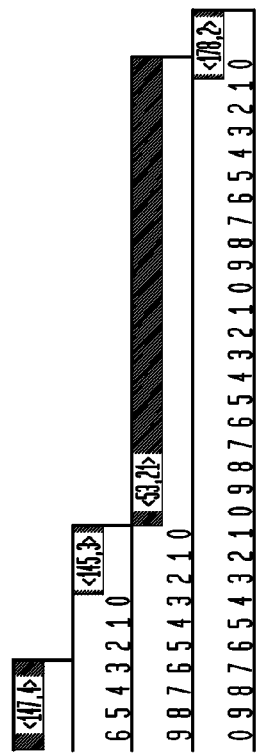

An example of such independent data (e.g., literal data) and dependent data (e.g., run length encoded (RLE) data) is illustrated in FIG. 4 for the first three lines of a selected translation of Genesis. For ease of reference and purposes of explanation, FIG. 4 has been illustrated in English, rather than digitally (e.g., ASCII) encoded, so any reference to a letter should be understood to mean an encoded version having a plurality of corresponding bits. As illustrated in FIG. 4, the first five words (with intervening spaces) are independent data (e.g., literal data), and once decompressed, may be provided directly as output into the uncompressed data file. Some of the data, however, has been run length encoded and is dependent data, with the RLE data providing the previous starting bit position (as determined from the current bit position) and the number of bits (or string length). As illustrated in FIG. 4, the dependent (RLE) data has been indicated as the data in the carats, namely <previous starting bit position, number of bits>, which for purposes of explanation, has been adapted in FIG. 4 to be <previous starting (letter) position, number of positions (letters)>. The first such dependent (RLE) data, <25,5> follows the independent (literal) data "In_the_beginning_God_created", and indicates that beginning at the previous $25^{th}$ position (with counting beginning at zero(0)), 5 positions (string length of 5) are to be duplicated in order at the current position which, in this case, provides for the insertion of "_the_" after the "d" of "created". The second such dependent (RLE) data, <14,6> follows the independent (literal) data "heaven_an", and indicates that beginning at the previous 14$^{th}$ position, 6 positions are to be duplicated in order at the current position which, in this case, provides for the insertion of "d_the_" after the "an". This latter example also illustrates linked or multiple data dependencies, with the second such dependent (RLE) data, <14,6> referring to data to be supplied following decompression of the first such dependent (RLE) data, <25,5>.

Additional examples are illustrated in FIG. 4, including many examples of linked or multiple data dependencies, including linked or multiple data dependencies referring to data to be supplied following decompression of multiple and separate data dependencies. It should be noted that the dependent (RLE) data generally occurs across multiple variable length blocks, such as going back as far as 32 Kbytes, so that RLE data in a current variable length block may reference data in any of a plurality of previous (i.e., earlier in the sequence of) variable length blocks.

The primary function of the one or more ordering (or "next") processor cores $120_C$ of the aggregation pipeline stage 315, however, is to maintain ordering (sequencing) of all of the partially decompressed data provided by each of the decompression processor core $120_B$, which may be provided to the ordering (or "next") cores $120_C$ out of order, depending upon how rapidly each decompression processor core $120_B$ partially decompresses its current variable length block, generally with one or more processor cores $120_B$ operating in parallel within the computation pipeline stage 310.

A number of variations are available for how the partially decompressed data (comprising independent (literal) data and dependent (RLE) data) is provided to and stored in memory 140 to form the uncompressed executable file 150.

In one variation, of the partially decompressed data, the independent (literal) data is moved (written or copied by the decompression processor core $120_B$) to the memory 140 in its corresponding location within the decompressed file 150, and the dependent (RLE) data is transferred to the one or more ordering (or "next") processor cores $120_C$. Alternatively, both the independent (literal) data and dependent (RLE) data may be transferred by the decompression processor core $120_B$ to the one or more ordering (or "next") processor cores $120_C$, with the one or more ordering (or "next") processor cores $120_C$ moving or copying the independent (literal) data to the memory 140 in its corresponding location within the decompressed file 150 and providing the dependent (RLE) data to the one or more processor cores $120_D$ which then use the dependent (RLE) data to complete the decompression and create the complete decompressed file 150. In another variation, the ordered, partially decompressed data (having been properly ordered by the one or more ordering (or "next") processor cores $120_C$) is provided directly to the one or more aggregation and merge processor cores 120, which transfer(s) the independent (literal) data into known locations in the memory 140, and knowing those memory locations, then uses the dependent (RLE) data to complete the decompression and create the complete decompressed file 150. In another variation, the partially decompressed data (in any order) generated by the decompression processor cores $120_B$ is provided directly to the one or more aggregation and merge processor cores $120_D$, which also provides the proper ordering of the variable length blocks (eliminating the separate functionality of the one or more processor cores $120_C$), which also transfer(s) the independent (literal) data into known locations in the memory 140, and knowing those memory locations, also then uses the dependent (RLE) data to complete the decompression and create the complete decompressed file 150.

The dependent (RLE) data, such as consisting of the RLE location (which is to be filled in) (such as a pointer to a memory 140 location), a starting position (or bit position) and a size (such as number of positions (or bits)) is or has then been provided to the one or more aggregation and merge cores $120_D$. The data held in the memory 140, to this point, comprises an ordered sequence of independent (literal) data, with many "holes" to be filled in by the dependent (RLE) data, with references as far back as 32 Kbytes, for example. Stated another way, to this point, the uncompressed data file looks like "swiss cheese", having ordered and valid independent data and empty regions at known locations to be filled in.

The one or more aggregation and merge processor cores $120_D$ utilize the dependent (RLE) data, generally in sequence (although not required to be done in sequence) and going back as far as provided by the type of data compression, such as 32 Kbytes for Gzip, locate the specified starting location and copies the specified number of bits or positions into the dependent (RLE) location in the memory 140. As this occurs, the vacancies left in the uncompressed data file are filled in, providing uncompressed and sequenced data needed for use in decompressing subsequent dependent (RLE) data, and the look back "window" for the dependent (RLE) data moves forward.

This aggregation and merge process performed by one or more processor cores $120_D$ may also be run in parallel across a plurality of aggregation and merge processor cores $120_D$, and provides additional acceleration on the order of about a two times (2×) improvement in speed. To do this, however, and maintain proper ordering and data dependencies as may be needed, an additional function is performed by the one or more decompression processor cores $120_B$, namely, "tagging" linked or multiply-dependent (RLE) data, which itself references back to (or is linked) to previous dependent (RLE) data. Such a tag or other identifier then informs the aggregation and merge processor cores $120_D$ of this additional, second-level (or secondary or multiple level) data dependency, such that the linked dependent (RLE) data is then decompressed in sequential order corresponding to the tagged linkage, or more simply, decompressed in any order subsequent to the decompression of the single-level dependent (RLE) data.

Stated another way, the determinations of the independent (literal) data may be done rapidly and in parallel, and in any order, (e.g., by the decompression processor cores $120_B$), usually in a computation (or decompression) pipeline stage 310, or in both the distribution pipeline stage 305 and the computation (or decompression) pipeline stage 310. Technically, the determinations of the single-level (non-linked) dependent (RLE) data could also be done rapidly and in parallel, and in any order, (e.g., by the decompression processor cores $120_B$), except insofar as the data-dependencies may span multiple compressed blocks, which may not necessarily be decompressed in order by the decompression processor cores $120_B$, but may be arriving out of order to the aggregation and merge processor cores $120_D$, which then order the partially decompressed blocks. As a result, in exemplary embodiments, once the independent (literal) data has been determined and the blocks have been ordered (e.g., by an ordering (or "next") processor core $120_C$ or equivalently by an aggregation and merge processor core $120_D$ programmed or configured with the block ordering functionality), the determinations of the single-level (non-linked) dependent (RLE) data also may be performed rapidly and in parallel, and in any order, such as by the aggregation and merge processor cores 120. When block order has been preserved for decompression of the independent (literal) data, however, the determinations of the dependent (RLE) data also may be done rapidly and in parallel, and in any order, (e.g., by the decompression processor cores $120_B$ or by the aggregation and merge processor cores $120_D$). Following those determinations, the linked dependent (RLE) data is then decompressed, and depending upon the level of linkage, such as a first level dependency on dependent (RLE) data, a second level dependency on linked dependent (RLE) data which has a first level dependency on dependent (RLE) data, a third level dependency on linked dependent (RLE) data which has a second level dependency on linked dependent (RLE) data which has a first level dependency on dependent (RLE) data, etc., those determinations of the linked dependent (RLE) data for any given level could also be done rapidly and in parallel, and in any order within that level or linkage, e.g., all first level decompressions may be done in parallel and in any order, followed sequentially by all second level decompressions being done in parallel and in any order, followed sequentially by all second level decompressions being done in parallel and in any order, etc. Accordingly, depending upon the desired complexity of implementation, the tagging process for linked dependent (RLE) data may also reflect the linkage levels, such as tagging for primary, secondary, tertiary, etc., linkages, which information may also be utilized by the aggregation and merge processor cores $120_D$ for added parallel processing in decompressing linked dependent (RLE) data.

Following all of the dependent (RLE) data insertions by the one or more processor cores $120_D$, a complete, uncompressed file 150 is now available in memory 140 for execution, for example and without limitation. A cyclic redundancy check (CRC) check may then be performed, by either the one or more aggregation and merge processor cores $120_D$, or by another processor core 120, such as a CRC processor core 120E.

In an exemplary embodiment, for another higher level (level 3) implementation, and depending upon the memory space available in nonvolatile memory 105, the uncompressed file 150 available in memory 140 may be recompressed, creating a second compressed file 130B which can be utilized to replace the first compressed file 130 in memory 140. The compression, however, is performed slightly differently, such that the second compressed file 130B does not have inter-block data dependencies. For example, the second compressed file 130B may consist of a plurality of blocks (typically having a size on the order of several megabytes, each of which may be comprised of smaller sub-blocks, typically on the order of 32 kbytes each), with data dependencies occurring solely within such a larger block (but data dependencies may occur across sub-blocks). When used subsequently, these recompressed blocks of the second compressed file 130B may be transferred directly to one or more decompression processor cores $120_B$, each of which may then decompress the block it has received, independently and in parallel, into independent (literal) data and dependent (RLE) data, and which may further directly use the dependent (RLE) data to form the uncompressed file 150. Preferably, metadata indicating or specifying the block boundaries of these recompressed blocks of the second compressed file 130B is also maintained, to allow for the ready distribution of the blocks directly to the one or more decompression processor cores $120_B$.

Figure 5A:
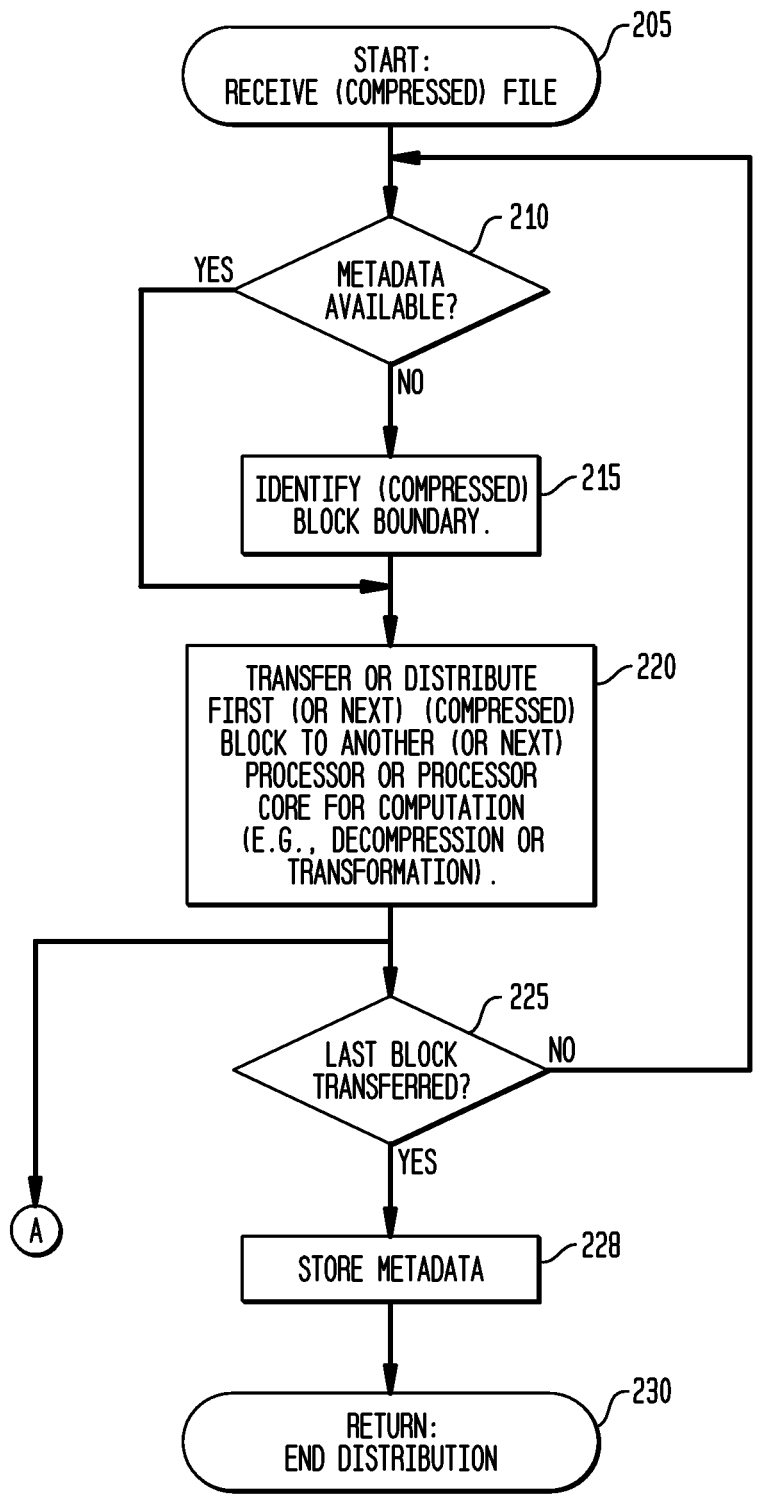
Figure 5C:
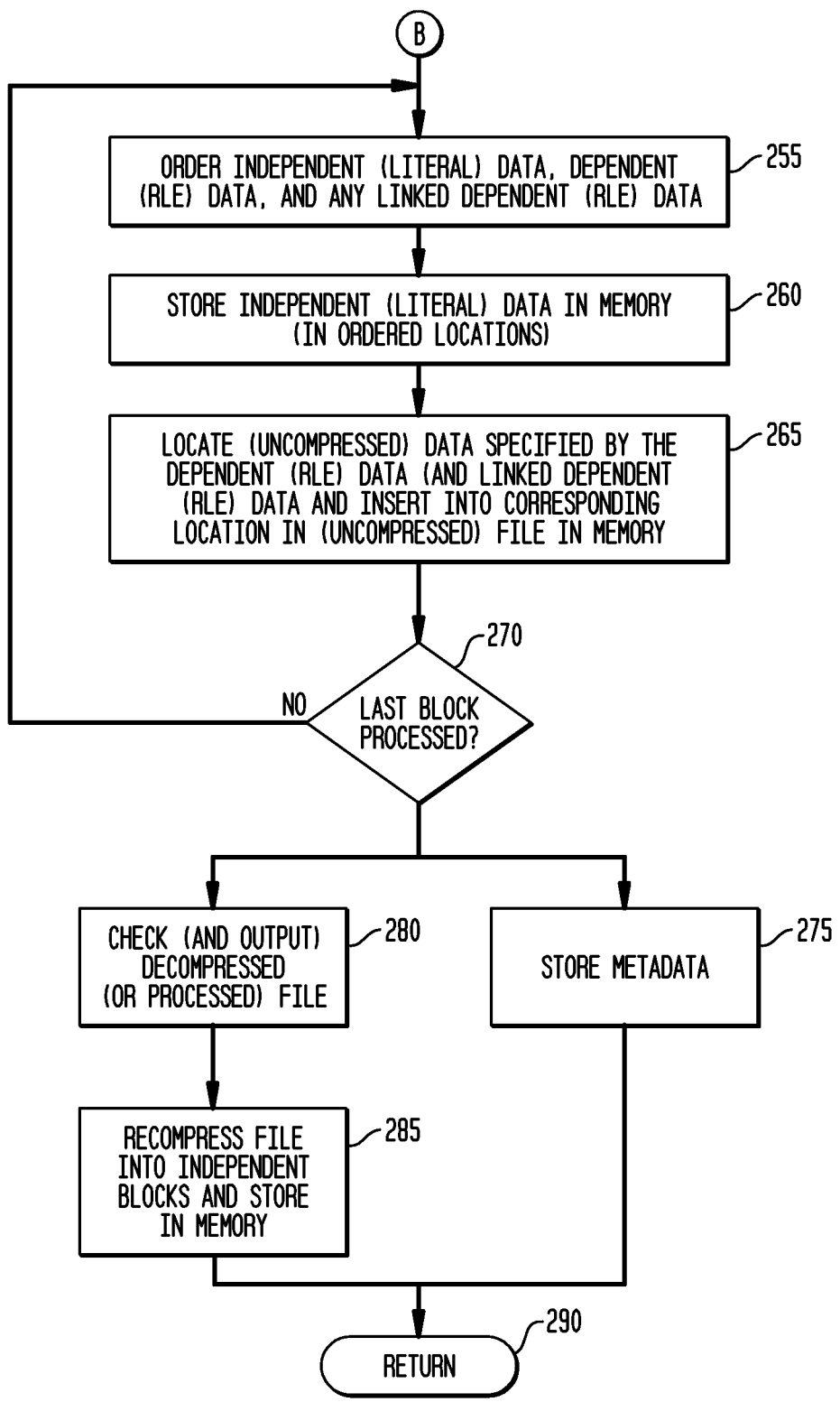

FIG. 5, divided into FIGS. 5A, 5B, and 5C, is a flow diagram illustrating exemplary or representative method and software embodiments, and provides a useful summary. It should be noted that many of the steps illustrated in FIG. 5 are performed independently and in parallel, with the arrows utilized to indicate a logical flow only and not an actual parallel implementation, as many steps will be occurring concurrently, in parallel and in pipelined stages, across the plurality of processors 110 and/or processor cores 120. For the software embodiments, executable processor and/or computer code may be written to perform the methodology of FIG. 5 for performance by the plurality of processor cores 120. Those having skill in the art will also recognized that while described with reference to a decompression application, the exemplary or representative method and software embodiments may be readily ported to other applications, as described above.

FIGS. 5A, 5B, and 5C also reflect the pipelined stages referred to above, with FIG. 5A pertaining to the distribution pipeline stage 305, with FIG. 5B pertaining to the computation (or decompression) pipeline stage 310, and with FIG. 5C pertaining to the aggregation pipeline stage 315. Beginning with start step 205, a data file such as a compressed data file is received, e.g., read from memory 105 to commence a boot process or when called by an operating system to launch an application selected by a user through the user interface 125. One or more of the plurality of processor cores 120, such as one or more distributor processor cores $120_A$, determines whether there is metadata available which indicates block boundaries for a plurality of variable length blocks for the compressed data file, step 210. When such metadata is not available in step 210, the one or more distributor processor cores $120_A$ partially decompress (or otherwise transform) the compressed data file (e.g., uses or creates a Huffman table) to the extent needed to determine or identify a block boundary, step 215, typically the end of the first or next variable length block. Using either the metadata or the determined block boundary of step 215, the one or more distributor processor cores $120_A$ transfers the current or next variable length block to another processor core 120 for continued decompression or other computation, step 220, such as to a decompression processor core $120_B$. The one or more distributor processor cores $120_A$ continue this process, step 225, returning to step 210, until the last block has been transferred. As an option, any block boundary metadata which has been generated may be stored, step 228, and the distribution process may end, step 230.

As the variable length blocks are determined and transferred by the one or more distributor processor cores $120_A$, in step 220, typically operating in parallel, each of the one or more decompression processor cores $120_B$ receives a variable length block (step 235) in the computation (or decompression) pipeline stage 310, as they are being generated in the distribution pipeline stage 305, and commences partial decompression or other processing, step 240, also typically operating in parallel. The partial decompression may include generating a Huffman table (if not generated in step 215 and transferred with the variable length block), and using the Huffman table, generating independent (literal) data and dependent (RLE) data, including any linked dependent (RLE) data. Multiply-dependent or linked dependent (RLE) data may also be tagged, as mentioned above, as part of the partial decompression of step 240. The independent (literal) data and dependent (RLE) data is then transferred for further processing by another processor core 120 or into memory, or both, depending upon the implementation, as mentioned above, step 245. The partial decompression and transferring of steps 240 and 245 is repeated until the end of the block is reached, step 250, at which point that decompression processor core $120_B$ may receive another variable length block for partial decompression, returning to step 235, with the process continuing until the last block has been received and processed (i.e., no more variable length blocks have been received) in step 252, and the decompression or other processing, transformation or computation may end, return step 254.

The independent (literal) data and dependent (RLE) data (including linked dependent (RLE) data) is then ordered, step 255, such as by an ordering (or "next") core $120_C$ ordering or sequencing the independent (literal) data and dependent (RLE) data from a plurality of variable length blocks, provided by the one or more decompression processor cores $120_B$, and is typically performed by one or more ordering (or "next") processor cores $120_C$. The independent (literal) data is then stored in memory (140), step 260, and the uncompressed data identified by the dependent (RLE) data is obtained and inserted in the corresponding dependent (RLE) location in the uncompressed file held in memory 140, by the one or more aggregation and merge processor cores 120, step 265. When additional variable length blocks are being processed, the method continues to perform steps 255, 260 and 265. When the last block has been processed, step 270, if not stored previously in step 228, any generated metadata may be stored for future use, step 275, the uncompressed file is checked (e.g., CRC checking as mentioned above) and output or otherwise available for execution, step 280. As an option, as mentioned above, the uncompressed file may be recompressed into blocks which do not have inter-block data dependencies to form a second compressed file 130B, which may then be stored in memory 105, step 285. Following step 280 or optional step 285, the methodology is complete and may end, step 290. It should be noted that the step of storing any metadata may also be performed as part of or after step 220, such as by a distributor processor core $120_A$, as each start or end of a compressed block is determined. Also, as mentioned above, many of the steps outlined in FIG. 5 are performed concurrently, pipelined and in parallel, as decompressed blocks are distributed, decompressed, ordered, etc.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

A processor 110 may be any type of processor, and may be embodied as one or more processors 110, configured, designed, programmed or otherwise adapted to perform the functionality discussed herein. As the term processor is used herein, a processor 110 may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or $E^2$PROM. A processor (such as processor 110), with its associated memory, may be adapted or configured (via programming, FPGA interconnection, or hard-wiring) to perform the methodology of the invention, as discussed above. For example, the methodology may be programmed and stored, in a processor 110 with its associated memory (and/or memory 140) and other equivalent components, as a set of program instructions or other code (or equivalent configuration or other program) for subsequent execution when the processor is operative (i.e., powered on and functioning). Equivalently, when the processor 110 may implemented in whole or part as FPGAs, custom ICs and/or ASICs, the FPGAs, custom ICs or ASICs also may be designed, configured and/or hard-wired to implement the methodology of the invention. For example, the processor 110 may be implemented as an arrangement of analog and/or digital circuits, controllers, microprocessors, DSPs and/or ASICs, collectively referred to as a "controller", which are respectively hard-wired, programmed, designed, adapted or configured to implement the methodology of the invention, including possibly in conjunction with a memory 140.

The memory 140 and/or memory 105, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 110), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory 140 may be adapted to store various look up tables, parameters, coefficients, other information and data, programs or instructions (of the software of the present invention), and other types of tables such as database tables.

As indicated above, the processor 110 is hard-wired or programmed, using software and data structures of the invention, for example, to perform the methodology of the present invention. As a consequence, the system and method of the present invention may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 110, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the memory 140, e.g., a floppy disk, a CDROM, a CD-RW, a DVD, a magnetic hard drive, an optical drive, or any other type of data storage apparatus or medium, as mentioned above.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An apparatus for parallel decompression of a compressed file, the apparatus comprising:
a first, nonvolatile memory storing the compressed file, the compressed file having a plurality of compressed blocks, the compressed file comprising independent data and dependent, run length encoded ("RLE") data having data-dependent references spanning multiple compressed blocks of the plurality of blocks;
one or more decompression processors or processor cores, of a plurality of processors or processor cores, each decompression processor or processor core programmed, adapted or configured to partially decompress a selected block into the independent data, the dependent RLE data, and any linked dependent RLE data; and
one or more aggregation and merge processors or processor cores, of the plurality of processors or processor cores, at least one aggregation and merge processor or processor core programmed, adapted or configured to sequence the independent data, dependent RLE data, and linked dependent RLE data from a plurality of partial decompressions of the plurality of compressed blocks, and at least one aggregation and merge processor or processor core programmed, adapted or configured to obtain data specified by the dependent RLE data and linked dependent RLE data, and insert the obtained data into corresponding locations to form an uncompressed data file.

2. The apparatus of claim 1, further comprising:
a plurality of decompression processors or processor cores, of the plurality of processors or processor cores, each decompression processor or processor core of the plurality of decompression processors or processor cores programmed, adapted or configured to partially decompress a corresponding selected block of the plurality of compressed blocks, in parallel, into the independent data, the dependent RLE data, and the linked dependent RLE data.

3. The apparatus of claim 1, further comprising:
at least one distributor processor or processor core, of the plurality of processors or processor cores, programmed, adapted or configured to identify a start or end of each compressed block of the plurality of compressed blocks and transfer a single or individuated compressed block to the one or more computation processors or processor cores.

4. The apparatus of claim 3, wherein the at least one distributor processor or processor core, of the plurality of processors or processor cores, is further programmed, adapted or configured to identify the start or end of a selected compressed block of the plurality of compressed blocks by performing a partial decompression of the selected block.

5. The apparatus of claim 3, wherein the at least one distributor processor or processor core is operative in a first pipelined stage, the one or more decompression processors or processor cores is operative in a second pipelined stage, and the one or more aggregation and merge processors or processor cores is operative in a third pipelined stage.

6. The apparatus of claim 1, further comprising:
a plurality of distributor processors or processor cores, of the plurality of processors or processor cores, each distributor processor or processor core of the plurality of distributor processors or processor cores programmed, adapted or configured to identify the start or end of one or more compressed blocks of the plurality of compressed blocks, in parallel, and transfer a single or individuated compressed block to the one or more computation processors or processor cores.

7. The apparatus of claim 6, wherein each distributor processor or processor core is further programmed, adapted or configured to identify the start or end of a selected compressed block of the plurality of compressed blocks by performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores.

8. The apparatus of claim 1, wherein at least one of the processors or processor cores is further programmed, adapted or configured to create and store, in the memory, metadata indicating a start or end of each compressed block of the plurality of compressed blocks.

9. The apparatus of claim 8, further comprising:
at least one distributor processor or processor core, of the plurality of processors or processor cores, programmed, adapted or configured to utilize the stored metadata to identify the start or end of the selected compressed block of the plurality of compressed blocks.

10. The apparatus of claim 1, further comprising:
a cyclic redundancy check processor or processor core of the plurality of processors or processor cores programmed, adapted or configured to perform a cyclic redundancy check of the uncompressed data file.

11. The apparatus of claim 1, further comprising:
a second, random access memory,
wherein at least one aggregation and merge processor or processor core is further programmed, adapted or configured to store the independent data in order in the second memory, to subsequently obtain data specified by the dependent RLE data and linked dependent RLE data, and insert the obtained data into corresponding locations in the second memory to form the uncompressed data file.

12. The apparatus of claim 1, wherein at least one of the processors or processor cores is further programmed, adapted or configured to compress and store the uncompressed data file in the memory as a second compressed file having a plurality of second compressed blocks which have data dependencies solely within a given second compressed block of the plurality of second compressed blocks.

13. The apparatus of claim 12, further comprising:
at least one distributor processor or processor core, of the plurality of processors or processor cores, programmed, adapted or configured to transfer each second compressed block of the plurality of second compressed blocks to the one or more decompression processors or processor cores.

14. The apparatus of claim 1, wherein at least one of the processors or processor cores is further programmed, adapted or configured to tag or identify the linked dependent RLE data.

15. The apparatus of claim 14, wherein at least one aggregation and merge processor or processor core is further programmed, adapted or configured to use the tag or identification of the linked dependent RLE data to sequence the obtaining of the data specified by the linked dependent RLE data subsequent to the obtaining of the data specified by the dependent RLE data.

16. The apparatus of claim 14, wherein the apparatus is embodied as a smartphone or tablet computer.

17. A processor-implemented method for parallel decompression of a compressed file, the compressed file having a plurality of compressed blocks, the compressed file comprising independent data and dependent, run length encoded ("RLE") data having data-dependent references spanning multiple compressed blocks of the plurality of blocks, the method comprising:
using one or more decompression processors or processor cores, of a plurality of processors or processor cores, partially decompressing a selected block into the independent data, the dependent RLE data, and any linked dependent RLE data; and
using one or more aggregation and merge processors or processor cores, of the plurality of processors or processor cores, sequencing the independent data, dependent RLE data, and linked dependent RLE data from a plurality of partial decompressions of the plurality of compressed blocks, and obtaining data specified by the dependent RLE data and linked dependent RLE data, and insert the obtained data into corresponding locations to form an uncompressed data file.

18. The processor-implemented method of claim 17, further comprising:
using a plurality of decompression processors or processor cores, of the plurality of processors or processor cores, partially decompressing a corresponding selected block of the plurality of compressed blocks, in parallel, into the independent data, the dependent RLE data, and the linked dependent RLE data.

19. The processor-implemented method of claim 17, further comprising:
using at least one distributor processor or processor core, of the plurality of processors or processor cores, identifying a start or end of each compressed block of the plurality of compressed blocks and transferring a single or individuated compressed block to the one or more computation processors or processor cores.

20. The processor-implemented method of claim 19, wherein the step of identifying the start or end of a selected compressed block of the plurality of compressed blocks further comprises:
performing a partial decompression of the selected block.

21. The processor-implemented method of claim 19, wherein the at least one distributor processor or processor core is operative in a first pipelined stage, the one or more decompression processors or processor cores is operative in a second pipelined stage, and the one or more aggregation and merge processors or processor cores is operative in a third pipelined stage.

22. The processor-implemented method of claim 17, further comprising:
using a plurality of distributor processors or processor cores, of the plurality of processors or processor cores, identifying the start or end of one or more compressed blocks of the plurality of compressed blocks, in parallel, and transferring a single or individuated compressed block to the one or more computation processors or processor cores.

23. The processor-implemented method of claim 22, wherein the step of identifying the start or end of a selected compressed block of the plurality of compressed blocks further comprises:
performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores.

24. The processor-implemented method of claim 17, further comprising:
creating and storing, in a memory, metadata indicating a start or end of each compressed block of the plurality of compressed blocks.

25. The processor-implemented method of claim 24, further comprising:
using at least one distributor processor or processor core, of the plurality of processors or processor cores, utilizing the stored metadata to identify the start or end of the selected compressed block of the plurality of compressed blocks.

26. The processor-implemented method of claim 17, further comprising:
using at least one processor or processor core of the plurality of processors or processor cores, performing a cyclic redundancy check of the uncompressed data file.

27. The processor-implemented method of claim 17, further comprising:
using at least one aggregation and merge processor or processor core, storing the independent data in order in a memory, subsequently obtaining data specified by the dependent RLE data and linked dependent RLE data, and inserting the obtained data into corresponding locations in the memory to form the uncompressed data file.

28. The processor-implemented method of claim 17, further comprising:
using at least one of the processors or processor cores, compressing and storing the uncompressed data file in a memory as a second compressed file having a plurality of second compressed blocks which have data dependencies solely within a given second compressed block of the plurality of second compressed blocks.

29. The processor-implemented method of claim 28, further comprising:
using at least one distributor processor or processor core, of the plurality of processors or processor cores, transferring each second compressed block of the plurality of second compressed blocks to the one or more decompression processors or processor cores.

30. The processor-implemented method of claim 17, further comprising:
using at least one of the processors or processor cores, tagging or identifying the linked dependent RLE data.

31. The processor-implemented method of claim 30, further comprising:
using at least one aggregation and merge processor or processor core, using the tag or identification of the linked dependent RLE data to sequence the obtaining of the data specified by the linked dependent RLE data subsequent to the obtaining of the data specified by the dependent RLE data.

32. The processor-implemented method of claim 17, wherein the method is operative in a smartphone or tablet to accelerate booting of an operating system or to accelerate launching of a computing application.

33. A non-transitory, tangible medium storing computer- or processor-readable software having a plurality of executable instructions for execution by one or more processors or processor cores for parallel decompression of a compressed file, the plurality of executable instructions operative in a smartphone or tablet to accelerate booting of an operating system or to accelerate launching of a computing application, the compressed file having a plurality of compressed blocks, the compressed file comprising independent data and dependent, run length encoded ("RLE") data having data-dependent references spanning multiple compressed blocks of the plurality of blocks, the non-transitory, tangible medium comprising:
one or more executable instructions, of the plurality of executable instructions, to cause one or more decompression processors or processor cores, of a plurality of processors or processor cores, to partially decompress a selected block into the independent data, the dependent RLE data, and any linked dependent RLE data; and
one or more executable instructions, of the plurality of executable instructions, to cause one or more aggregation and merge processors or processor cores, of the plurality of processors or processor cores, to sequence the independent data, dependent RLE data, and linked dependent RLE data from a plurality of partial decompressions of the plurality of compressed blocks, to obtain data specified by the dependent RLE data and linked dependent RLE data, and to insert the obtained data into corresponding locations to form an uncompressed data file.

34. The non-transitory, tangible medium of claim 33, further comprising:
one or more executable instructions, of the plurality of executable instructions, to cause a plurality of decompression processors or processor cores, of the plurality of processors or processor cores, to partially decompress a corresponding selected block of the plurality of compressed blocks, in parallel, into the independent data, the dependent RLE data, and the linked dependent RLE data.

35. The non-transitory, tangible medium of claim 33, further comprising:
one or more executable instructions, of the plurality of executable instructions, to cause at least one distributor processor or processor core, of the plurality of processors or processor cores, to identify a start or end of each compressed block of the plurality of compressed blocks by performing a partial decompression of the selected block and transfer a single or individuated compressed block to the one or more computation processors or processor cores.

36. The non-transitory, tangible medium of claim 33, further comprising:
one or more executable instructions, of the plurality of executable instructions, to cause a plurality of distributor processors or processor cores, of the plurality of processors or processor cores, to identify the start or end of one or more compressed blocks of the plurality of compressed blocks, in parallel, by performing a partial decompression of the selected block, each distributor processor or processor core commencing the partial decompression at a starting point in a compressed block having a predetermined or variable offset from partial decompression starting points of other distributor processors or processor cores of the plurality of distributor processors or processor cores, and to transfer a single or individuated compressed block to the one or more computation processors or processor cores.

37. The non-transitory, tangible medium of claim 33, further comprising:
one or more executable instructions, of the plurality of executable instructions, to cause one or more processors or processor cores, of the plurality of processors or processor cores, to create and store, in a memory, metadata indicating a start or end of each compressed block of the plurality of compressed blocks.

38. The non-transitory, tangible medium of claim 37, further comprising:
one or more executable instructions, of the plurality of executable instructions, to cause at least one distributor processor or processor core, of the plurality of processors or processor cores, to utilize the stored metadata to identify the start or end of the selected compressed block of the plurality of compressed blocks.

39. The non-transitory, tangible medium of claim 33, further comprising:
one or more executable instructions, of the plurality of executable instructions, to cause at least one processor or processor core of the plurality of processors or processor cores, to perform a cyclic redundancy check of the uncompressed data file.

40. The non-transitory, tangible medium of claim 33, further comprising:
one or more executable instructions, of the plurality of executable instructions, to cause at least one aggregation and merge processor or processor core, to store the independent data in order in a memory, to subsequently obtain data specified by the dependent RLE data and linked dependent RLE data, and to insert the obtained data into corresponding locations in the memory to form the uncompressed data file.

41. The non-transitory, tangible medium of claim 33, further comprising:
using at least one of the processors or processor cores, compressing and storing the uncompressed data file in a memory as a second compressed file having a plurality of second compressed blocks which have data dependencies solely within a given second compressed block of the plurality of second compressed blocks.

42. The non-transitory, tangible medium of claim 41, further comprising:
one or more executable instructions, of the plurality of executable instructions, to cause at least one distributor processor or processor core, of the plurality of processors or processor cores, to transfer each second compressed block of the plurality of second compressed blocks to the one or more decompression processors or processor cores.

43. The non-transitory, tangible medium of claim 33, further comprising:
one or more executable instructions, of the plurality of executable instructions, to cause at least one of the processors or processor cores, to tag or identify the linked dependent RLE data; and
one or more executable instructions, of the plurality of executable instructions, to cause at least one aggregation and merge processor or processor core, to use the tag or identification of the linked dependent RLE data to sequence the obtaining of the data specified by the linked dependent RLE data subsequent to the obtaining of the data specified by the dependent RLE data.

44. An apparatus for parallel decompression of a compressed file, the apparatus comprising:
a first, nonvolatile memory storing the compressed file, the compressed file having a plurality of compressed blocks, the compressed file comprising independent data and dependent, run length encoded ("RLE") data having data-dependent references spanning multiple compressed blocks of the plurality of blocks, the first memory further storing metadata indicating a start or end of each compressed block of the plurality of compressed blocks;
at least one distributor processor or processor core, of a plurality of processors or processor cores, programmed, adapted or configured to utilize the stored metadata to identify the start or end of the selected compressed block of the plurality of compressed blocks;
a plurality of decompression processors or processor cores, of the plurality of processors or processor cores, each decompression processor or processor core of the plurality of decompression processors or processor cores programmed, adapted or configured to partially decompress a corresponding selected block of the plurality of compressed blocks, in parallel, into independent data, dependent RLE data, and any linked dependent RLE data; and
one or more aggregation and merge processors or processor cores, of the plurality of processors or processor cores, at least one aggregation and merge processor or processor core programmed, adapted or configured to sequence the independent data, dependent RLE data, and linked dependent RLE data from a plurality of partial decompressions of the plurality of compressed blocks, and at least one aggregation and merge processor or processor core programmed, adapted or configured to obtain data specified by the dependent RLE data and linked dependent RLE data, and insert the obtained data into corresponding locations to form an uncompressed data file.

45. The apparatus of claim 44, wherein at least one of the processors or processor cores is further programmed, adapted or configured to tag or identify the linked dependent RLE data.

46. The apparatus of claim 45, wherein at least one aggregation and merge processor or processor core is further programmed, adapted or configured to use the tag or identification of the linked dependent RLE data to sequence the obtaining of the data specified by the linked dependent RLE data subsequent to the obtaining of the data specified by the dependent RLE data.

47. The apparatus of claim 44, wherein the apparatus is embodied as a smartphone or tablet computer.

48. An apparatus for parallel processing of a file, the apparatus comprising:
- a first, nonvolatile memory storing the file, the file having a plurality of blocks, the file including independent data and dependent data having data dependencies spanning multiple blocks of the plurality of blocks;
- a second, random access memory;
- at least one distributor processor or processor core, of a plurality of processors or processor cores, programmed, adapted or configured to identify a start or end of each block of the plurality of blocks and transfer a single or individuated block to the one or more computation processors or processor cores;
- a plurality of computation processors or processor cores, of the plurality of processors or processor cores, each computation processor or processor core coupled to the at least one distributor processor or processor core and programmed, adapted or configured to partially transform, in parallel, a selected block into independent data, dependent data, and linked dependent data; and
- one or more aggregation and merge processors or processor cores, of the plurality of processors or processor cores, at least one aggregation and merge processor or processor core coupled to the plurality of computation processors or processor cores and programmed, adapted or configured to sequence the independent data, dependent data, and linked dependent data from a plurality of partial transformations of a plurality of blocks, and at least one aggregation and merge processor or processor core programmed, adapted or configured to store the independent data in order in the second memory, to subsequently obtain data specified by the dependent data and linked dependent data, and insert the obtained data into a corresponding location in the second memory to form a resulting processed file.

49. The apparatus of claim 48, wherein at least one of the processors or processor cores is further programmed, adapted or configured to create and store, in the memory, metadata indicating a start or end of each block of the plurality of blocks.

50. The apparatus of claim 48, further comprising:
- a plurality of distributor processors or processor cores, of the plurality of processors or processor cores, each distributor processor or processor core further programmed, adapted or configured to identify the start or end of a selected block of the plurality of compressed blocks by performing a partial transformation of the selected block, each distributor processor or processor core commencing the partial transformation at a starting point in a block having a predetermined or variable offset from partial transformation starting points of other distributor processors or processor cores of the plurality of distributor processors or processor cores.

51. The apparatus of claim 48, wherein at least one of the processors or processor cores is further programmed, adapted or configured to tag or identify the linked dependent data, and wherein at least one aggregation and merge processor or processor core is further programmed, adapted or configured to use the tag or identification of the linked dependent data to sequence the obtaining of the data specified by the linked dependent data subsequent to the obtaining of the data specified by the dependent data.

* * * * *